US012557573B2

(12) United States Patent
Sakurai et al.

(10) Patent No.: US 12,557,573 B2
(45) Date of Patent: Feb. 17, 2026

(54) SEMICONDUCTOR DEVICE PROVIDED WITH AT LEAST IGBT

(71) Applicant: FUJI ELECTRIC CO., LTD., Kanagawa (JP)

(72) Inventors: Yosuke Sakurai, Azumino (JP); Seiji Noguchi, Matsumoto (JP); Takashi Yoshimura, Matsumoto (JP); Hiroshi Takishita, Matsumoto (JP); Misaki Uchida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/703,934

(22) Filed: Mar. 24, 2022

(65) Prior Publication Data

US 2022/0328313 A1 Oct. 13, 2022

(30) Foreign Application Priority Data

Apr. 8, 2021 (JP) .................................. 2021-066101

(51) Int. Cl.
| | |
|---|---|
| *H01L 21/22* | (2006.01) |
| *H01L 21/265* | (2006.01) |
| *H10D 8/00* | (2025.01) |
| *H10D 12/00* | (2025.01) |

(Continued)

(52) U.S. Cl.
CPC ...... *H01L 21/221* (2013.01); *H01L 21/26526* (2013.01); *H10D 8/422* (2025.01);
(Continued)

(58) Field of Classification Search
CPC ... H01L 27/0664; H01L 27/0761–0766; H01L 27/0629; H01L 29/66712–66734;
(Continued)

(56) References Cited

U.S. PATENT DOCUMENTS

| | | |
|---|---|---|
| 2013/0249058 A1 | 9/2013 | Neidhart |
| 2015/0050754 A1 | 2/2015 | Ploss |

(Continued)

FOREIGN PATENT DOCUMENTS

| | | |
|---|---|---|
| JP | 2004165619 A | 6/2004 |
| JP | 2007266233 A | 10/2007 |

(Continued)

OTHER PUBLICATIONS

Office Action issued for counterpart Japanese Application No. 2021-066101, transmitted from the Japanese Patent Office on Dec. 10, 2024 (drafted on Dec. 5, 2024).

*Primary Examiner* — Jesse Y Miyoshi

(57) ABSTRACT

Provided is a semiconductor device provided with an IGBT, comprising: a semiconductor substrate having upper and lower surfaces, throughout which bulk donors are distributed; a hydrogen peak including a local maximum arranged 25 μm or more away from the lower surface of the semiconductor substrate in a depth direction, at which a hydrogen chemical concentration shows a local maximum value; an upper tail where the hydrogen chemical concentration decreases in a direction from the local maximum toward the upper surface; and a lower tail where the hydrogen chemical concentration decreases in a direction from the local maximum toward the lower surface more gradually than the upper tail; and a first high concentration region having a donor concentration higher than a bulk donor concentration and including a region extending for 4 μm or more in a direction from the local maximum of the hydrogen peak toward the upper surface.

29 Claims, 18 Drawing Sheets

(51) Int. Cl.
*H10D 62/17* (2025.01)
*H10D 62/53* (2025.01)
*H10D 84/60* (2025.01)

(52) U.S. Cl.
CPC ......... *H10D 12/481* (2025.01); *H10D 62/393* (2025.01); *H10D 62/53* (2025.01); *H10D 84/617* (2025.01)

(58) Field of Classification Search
CPC ............. H01L 29/7804; H01L 29/7805; H01L 29/7395–7397; H01L 29/66333–66348; H10D 12/441; H10D 12/461; H10D 12/481; H10D 12/032; H10D 12/035; H10D 12/038; H10D 30/0291; H10D 30/0293; H10D 30/0295; H10D 30/0297; H10D 30/66; H10D 30/662; H10D 30/668; H10D 62/60
See application file for complete search history.

(56) References Cited

U.S. PATENT DOCUMENTS

| | | |
|---|---|---|
| 2015/0270132 A1 | 9/2015 | Laven |
| 2015/0357229 A1 | 12/2015 | Schulze |
| 2015/0371858 A1 | 12/2015 | Laven |
| 2016/0141399 A1 | 5/2016 | Jelinek |
| 2016/0329401 A1 | 11/2016 | Laven |
| 2016/0372329 A1 | 12/2016 | Jelinek |
| 2017/0271447 A1* | 9/2017 | Tamura ............... H01L 21/2253 |
| 2018/0005829 A1 | 1/2018 | Takishita |
| 2018/0122895 A1 | 5/2018 | Jelinek |
| 2020/0135847 A1 | 4/2020 | Kiyoi |
| 2020/0381515 A1 | 12/2020 | Tamura |
| 2021/0028019 A1 | 1/2021 | Mukai |
| 2021/0050215 A1 | 2/2021 | Agata |
| 2022/0013368 A1 | 1/2022 | Agata |

FOREIGN PATENT DOCUMENTS

| | | |
|---|---|---|
| JP | 2014138173 A | 7/2014 |
| JP | 2015037194 A | 2/2015 |
| JP | 2018137454 A | 8/2018 |
| WO | 2016204227 A1 | 12/2016 |
| WO | 2017047276 A1 | 3/2017 |
| WO | 2017047285 A1 | 3/2017 |
| WO | 2019017034 A1 | 1/2019 |
| WO | 2020100997 A1 | 5/2020 |
| WO | 2021070584 A1 | 4/2021 |

\* cited by examiner

SEMICONDUCTOR DEVICE PROVIDED WITH AT LEAST IGBT

BACKGROUND

1. Technical Field

The present invention relates to a semiconductor device and a manufacturing method.

2. Related Art

Conventionally, a technique for implanting protons to a semiconductor substrate to form a buffer region is known (for example, see Patent Document 1).
Patent Document 1: Japanese Patent Application Publication No. 2014-138173

DESCRIPTION OF EXEMPLARY EMBODIMENTS

Figure 1:
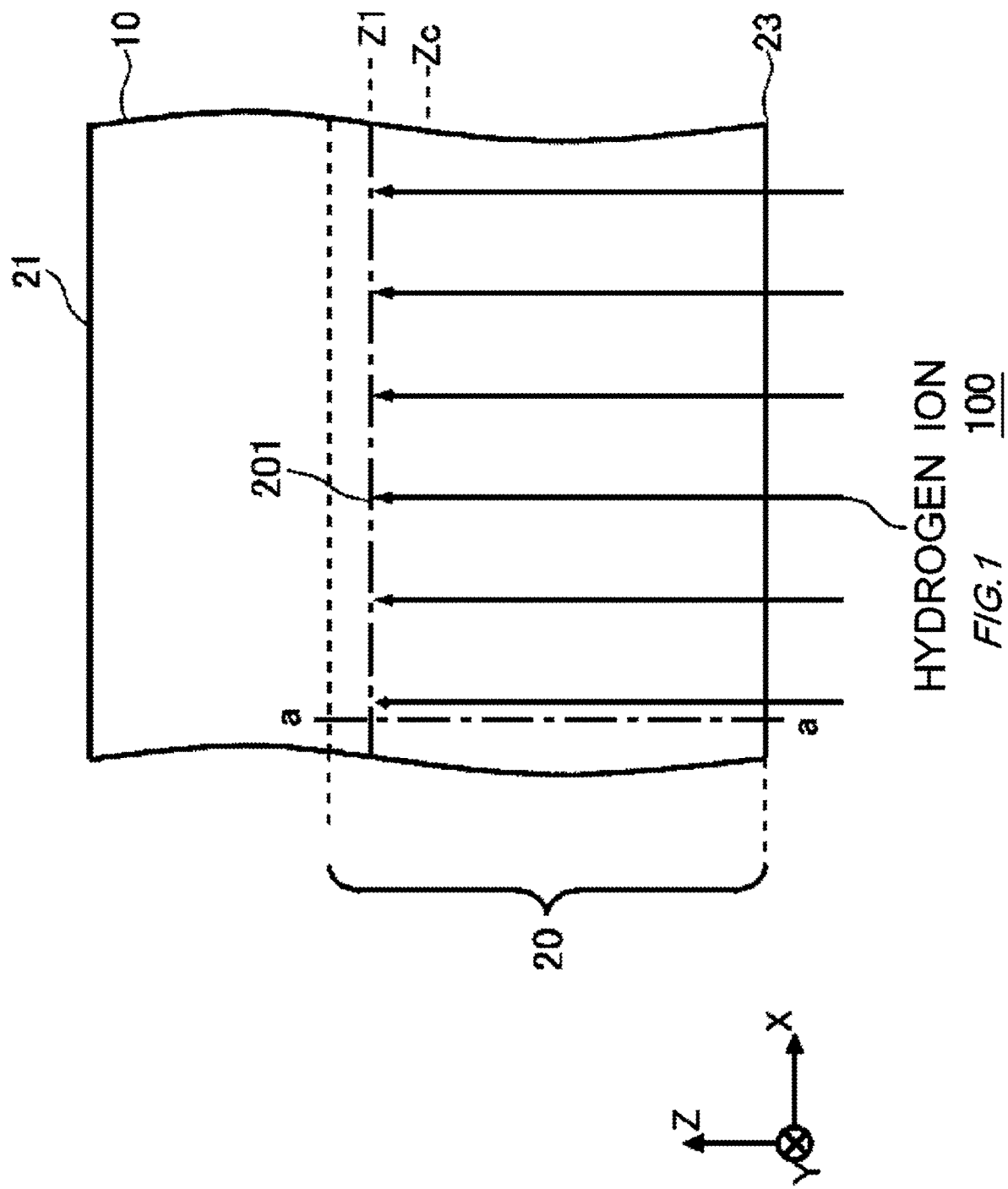
FIG. 1 is a cross-sectional view illustrating an example of a semiconductor device 100.

Hereinafter, the present invention will be described through embodiments of the invention, but the following embodiments do not limit the claimed invention. In addition, not all the combinations of features described in the embodiments are essential to the solution of the invention.

In the present specification, one side in a direction parallel to a depth direction of a semiconductor substrate is referred to as "upper", and the other side is referred to as "lower". One of two main surfaces of a substrate, a layer, or another member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely identify relative positions of components, and do not limit a specific direction. For example, the Z axis does not limit the height direction with respect to the ground. It is noted that a +Z axis direction and a −Z axis direction are opposite to each other. When the Z axis direction is described without describing the signs, it means that the direction is parallel to the +Z axis and the −Z axis.

In the present specification, assume that the orthogonal axes parallel to the upper surface and the lower surface of the semiconductor substrate are the X axis and the Y axis. In addition, assume that the axis perpendicular to the upper surface and the lower surface of the semiconductor substrate is the Z axis. In the present specification, the direction of the Z axis may be referred to as the depth direction. In addition, in the present specification, a direction parallel to the upper surface and the lower surface of the semiconductor substrate, including the X axis and the Y axis, may be referred to as a horizontal direction. In the present specification, an upper surface side of the semiconductor substrate refers to a region from the center to the upper surface of the semiconductor substrate in the depth direction. A lower surface side of the semiconductor substrate refers to a region from the center to the lower surface of the semiconductor substrate in the depth direction.

In the present specification, a case where a term such as "same" or "equal" is mentioned may include a case where an error due to a variation in manufacturing or the like is included. The error is within, for example, 10%.

In the present specification, the conductivity type of a doping region doped with impurities is described as a P type or an N type. In the present specification, the impurity may particularly mean either a donor of the N type or an acceptor of the P type, and may be described as a dopant. In the present specification, doping means that a donor or an acceptor is introduced to the semiconductor substrate to form a semiconductor having an N type conductivity or a semiconductor having a P type conductivity.

In the present specification, a doping concentration means the concentration of donors or the concentration of acceptors in a thermal equilibrium state. In the present specification, a net doping concentration means a net concentration obtained by adding the donor concentration as the concentration of positive ions to the acceptor concentration as the concentration of negative ions, including the polarities of charges. By way of example, when assuming that the donor concentration is $N_D$ and the acceptor concentration is $N_A$, the net net doping concentration at an arbitrary position is $N_D$-$N_A$.

The donor has the function of supplying electrons to the semiconductor. The acceptor has the function of accepting electrons from the semiconductor. The donor and the acceptor are not limited to impurities themselves. For example, a VOH defect caused by a combination of a vacancy (V), an oxygen (O), and a hydrogen (H) existing in the semiconductor serves as a donor to supply electrons.

The term P+ type or N+ type described in the present specification means that the doping concentration is higher than that of the P type or N type, and the term P− type or N-type described in the present specification means that the doping concentration is lower than that of the P type or N type. In addition, the term P++ type or N++ type described in the present specification means that the doping concentration is higher than that of the P+ type or N+ type.

A chemical concentration in the present specification indicates an atomic density of impurities measured regardless of the state of electrical activation. The chemical concentration (atomic density) can be measured by secondary ion mass spectrometry (SIMS), for example. The above-mentioned net doping concentration can be measured by voltage-capacitance profiling (CV method). In addition, a carrier density measured by a spreading resistance method (SRP method) may be used as the net doping concentration. It may be assumed that the carrier density measured by the CV method or the SRP method is a value in a thermal equilibrium state. In addition, because, in an N type region, the donor concentration is sufficiently larger than the acceptor concentration, the carrier density in the region may be used as the donor concentration. Similarly, the carrier density in a P type region may be used as the acceptor concentration in the region.

In addition, in a case where the concentration distribution of a donor, an acceptor, or net doping has a peak, the peak value may be used as the concentration of the donor, the acceptor, or the net doping in the region. In a case where the concentration of a donor, an acceptor, or net doping is substantially uniform or the like, the average value of the concentration of the donor, the acceptor, or the net doping in the region may be used as the concentration of the donor, the acceptor, or the net doping.

The carrier density measured by the SRP method may be lower than the concentration of a donor or an acceptor. In a range where current flows when a spreading resistance is measured, the carrier mobility of the semiconductor substrate may be lower than a value of a crystal state. The decrease in the carrier mobility occurs when carriers are scattered due to disorder (disorder) of a crystal structure due to a lattice defect or the like.

The concentration of a donor or an acceptor calculated from a carrier density measured by the CV method or the SRP method may be lower than a chemical concentration of an element indicating the donor or the acceptor. By way of example, the donor concentration of phosphorus or arsenic as a donor, or the acceptor concentration of boron (boron) as an acceptor in a silicon semiconductor is approximately 99% of chemical concentrations of these. On the other hand, the donor concentration of hydrogen as a donor in the silicon semiconductor is approximately 0.1% to 10% of the chemical concentration of hydrogen.

FIG. 1 is a cross-sectional view illustrating an example of a semiconductor device 100. The semiconductor device 100 includes a semiconductor substrate 10. The semiconductor substrate 10 is a substrate formed of semiconductor material. By way of example, the semiconductor substrate 10 is a silicon substrate.

An IGBT (Insulated Gate Bipolar Transistor) is formed in the semiconductor substrate 10 in this example. A diode element such as a FWD (Free Wheeling Diode) may further be formed in the semiconductor substrate 10. In FIG. 1, each electrode and each region of the IGBT and the diode element provided in the interior of the semiconductor substrate 10 are omitted.

Throughout the semiconductor substrate 10 of this example, N type bulk donors are distributed. The bulk donor is a dopant donor substantially uniformly contained in an ingot from which the semiconductor substrate 10 is made, during the production of the ingot. The bulk donor of this example is an element other than hydrogen. The bulk donor dopant is, for example, an element of group V or group VI, and is, for example, phosphorus, antimony, arsenic, selenium, or sulfur, but not limited thereto. The bulk donor of this example is phosphorus. The bulk donor is also contained in a P type region. The semiconductor substrate 10 may be a wafer cut out from a semiconductor ingot, or may be a chip obtained by singulating the wafer. The semiconductor ingot may be manufactured by any of a Czochralski method (CZ method), a magnetic-field applied Czochralski method (MCZ method), or a float zone method (FZ method).

An oxygen chemical concentration contained in the semiconductor substrate 10 manufactured by the MCZ method is, by way of example, $1 \times 10^{17}$-$1 \times 10^{18}$ atoms/cm$^3$. The oxygen chemical concentration may be $7 \times 10^{17}$ atoms/cm$^3$ or less. An oxygen chemical concentration contained in the semiconductor substrate 10 manufactured by the FZ method is, by way of example, $1 \times 10^{15}$-$5 \times 10^{16}$ atoms/cm$^3$. The oxygen chemical concentration of the semiconductor substrate 10 may be within the above-mentioned range over the entire substrate. However, in the vicinity of a main surface of the semiconductor substrate 10, oxygen may be released to the outside of the substrate by annealing processing or the like. An oxygen chemical concentration of the vicinity of the surface of the semiconductor substrate 10 may be below the lower limit of the above-mentioned range.

A carbon chemical concentration in the semiconductor substrate 10 is, by way of example, $1 \times 10^{13}$-$1 \times 10^{16}$ atoms/cm$^3$. The carbon chemical concentration of the semiconductor substrate 10 may be within the above-mentioned range over the entire substrate. The oxygen chemical concentration and the carbon chemical concentration of the semiconductor substrate 10 may be monotonously increased or monotonously decreased in a direction from the one main surface toward the other main surface, or may be constant.

As a bulk donor concentration, a chemical concentration of bulk donors distributed throughout the semiconductor substrate 10 may be used, or a value between 90% and 100% of the chemical concentration may be used. In a semiconductor substrate doped with dopants of group V or group VI, such as phosphorus, the bulk donor concentration may be $1\times10^{11}/cm^3$ or more and $3\times10^{13}/cm^3$ or less. The bulk donor concentration of the semiconductor substrate doped with dopants of group V or group VI is preferably $1\times10^{12}/cm^3$ or more and $1\times10^{13}/cm^3$ or less. In addition, as the semiconductor substrate 10, a non-doped substrate substantially not containing a bulk dopant such as phosphorus may be used. In this case, the bulk donor concentration of the non-doped substrate is, for example, $1\times10^{10}$ cm$^3$ or more and $5\times10^{12}/cm^3$ or less. The bulk donor concentration of the non-doped substrate is preferably $1\times10^{11}/cm^3$ or more. The bulk donor concentration of the non-doped substrate is preferably $5\times10^{12}/cm^3$ or less.

The semiconductor substrate 10 has an upper surface 21 and a lower surface 23. The upper surface 21 and the lower surface 23 are two main surfaces of the semiconductor substrate 10. In the present specification, assume that orthogonal axes in a plane being parallel to the upper surface 21 and the lower surface 23 are an X axis and a Y axis, and an axis perpendicular to the upper surface 21 and the lower surface 23 is a Z axis. In the upper surface 21, a gate structure of the IGBT may be provided. The gate structure is a structure including a gate electrode (for example, a gate conductive portion 44 described below) and a gate dielectric film 42.

In the semiconductor substrate 10, hydrogen ions are implanted to a predetermined depth position Z1 from the lower surface 23. In the present specification, a distance from the lower surface 23 in the Z axis direction may be referred to as a depth position. In the present specification, assume that the center position of the semiconductor substrate 10 in the depth direction is a depth position Zc. The depth position Z1 is a position at which the distance from the lower surface 23 in the Z axis direction is Z1. The depth position Z1 in this example is 25 μm or more. The depth position Z1 of this example is arranged on an upper surface 21 side (a region between the depth position Zc and the upper surface 21) of the semiconductor substrate 10. The depth position Z1 may be arranged on a lower surface 23 side (a region between the depth position Zc and the lower surface 23) of the semiconductor substrate 10.

Implanting hydrogen ions to the depth position Z1 refers to that the average distance (which is also referred to as the range) that hydrogen ions pass through the interior of the semiconductor substrate 10 is Z1. The hydrogen ions are accelerated by an acceleration energy corresponding to the predetermined depth position Z1 to be introduced to the interior of the semiconductor substrate 10. Even if hydrogen ions are implanted at the same acceleration energy, the implantation position of the hydrogen ions can be adjusted by an absorber arranged on the implanting surface of the hydrogen ions (the lower surface 23 in this example).

Assume that a region, in the interior of the semiconductor substrate 10, through which hydrogen ions have passed is a passed-through region. In the example of FIG. 1, a region from the lower surface 23 of the semiconductor substrate 10 to the depth position Z1 is the passed-through region. Some of hydrogen ions pass through the semiconductor substrate 10 up to the upper surface 21 side relative to the depth position Z1. It may be assumed that a region through which hydrogen ions with a predetermined concentration have passed is the passed-through region. For example, the predetermined concentration may be a half value of the chemical concentration of hydrogens implanted to the depth position Z1. In this case, the passed-through region includes a region on the upper surface 21 side relative to the depth position Z1, by a half width of the hydrogen chemical concentration distribution. Hydrogen ions may be implanted to the entire surface of the semiconductor substrate 10 on the XY plane, or may be implanted to only a partial region. In this example, hydrogen ions are implanted to the entire surface of the semiconductor substrate 10.

In the passed-through region, in the semiconductor substrate 10, through which hydrogen ions are passed, lattice defects mainly composed of vacancies, such as monatomic vacancies (V), diatomic vacancies (VV) are formed. Atoms adjacent to the vacancies have dangling bonds. Although lattice defects may include interstitial atoms, dislocations or the like, and in a broad sense, may include donors and acceptors, in the present specification, lattice defects mainly composed of vacancies may be referred to as vacancy-type lattice defects, vacancy-type defects, or merely lattice defects. The lattice defect mainly composed of the vacancy may function as a recombination center of electrons and hole carriers. The recombination center, the vacancy, and the lattice defect may have a distribution similar to one another. In addition, because many lattice defects are formed due to the hydrogen ion implantation into the semiconductor substrate 10, crystallinity of the semiconductor substrate 10 may be strongly disturbed. In the present specification, this crystallinity disturbance may be referred to as a disorder.

In addition, oxygen is contained throughout the semiconductor substrate 10. The oxygen is intentionally or unintentionally introduced during the manufacture of the semiconductor ingot. In addition, by implanting hydrogen ions, hydrogen is contained in a passed-through region. In addition, by performing heat treatment (which may be referred to as annealing in the present specification) on the semiconductor substrate 10 after the hydrogen ions are implanted, hydrogen ions diffuse to the passed-through region. In this example, hydrogen is distributed throughout the passed-through region.

After the hydrogen ions are implanted to the semiconductor substrate 10, hydrogen (H), vacancy (V), and oxygen (O) are attached to form a VOH defect inside the semiconductor substrate 10. In addition, by performing the annealing on the semiconductor substrate 10, hydrogen diffuses, thus facilitating the formation of the VOH defect. In addition, because hydrogen can be attached to a vacancy by performing the annealing after forming the passed-through region, the release of hydrogen from the lower surface 23 to the outside of the semiconductor substrate 10 can be suppressed.

The VOH defect functions as a donor supplying electrons. In the present specification, the VOH defect may simply be referred to as a hydrogen donor or a donor. In the semiconductor substrate 10 of this example, a hydrogen donor is formed in the passed-through region.

In addition, by implanting hydrogen ions under a predetermined condition, a lattice defect can be formed on the further upper surface 21 side relative to the passed-through region. In this case, a hydrogen donor is formed on the further upper surface 21 side relative to the passed-through region. Particularly, it is experimentally confirmed that a hydrogen donor is more easily formed on the upper surface 21 side relative to the passed-through region, when hydrogen ions are implanted at an acceleration energy of 1.4 MeV or more. By setting the depth position Z1 at 25 μm or more, the acceleration energy of the hydrogen ions becomes 1.4 MeV or more. Therefore, the hydrogen donor can be more easily formed on the upper surface 21 side relative to the depth position Z1 (or the passed-through region).

With respect to the upper surface 21, the depth position Z1 may be arranged in a range of ¾ or less of the thickness of the semiconductor substrate 10, may be arranged in a range of ½ or less of the thickness of the semiconductor substrate 10, and may be arranged in a range of ¼ or less of the thickness of the semiconductor substrate 10. The depth position Z1 may be arranged in a range of ¼ or less of the thickness of the semiconductor substrate 10 with respect to the lower surface 23. By arranging the absorber on the lower surface 23, even if the distance between the depth position Z1 and the lower surface 23 is small, the hydrogen ions can be implanted at high acceleration energy.

A doping concentration of hydrogen donors at each position is lower than a chemical concentration of hydrogen at each position. The ratio of the chemical concentration of hydrogen to the doping concentration of hydrogen donors (VOH defects) may be a value of 0.1%-30% (that is, 0.001 or more and 0.3 or less). In this example, the ratio of the chemical concentration of hydrogen to the doping concentration of hydrogen donors (VOH defects) is 1%-5%. It is noted that, unless otherwise particularly noted, in the present specification, both VOH defects having a distribution similar to a chemical concentration distribution of hydrogen, and VOH defects similar to a distribution of vacancy defects of the passed-through region are referred to as hydrogen donors or hydrogen as donors.

Forming a hydrogen donor in the passed-through region of the semiconductor substrate 10 enables the donor concentration in the passed-through region to be higher than the doping concentration of the bulk donor (which may be simply referred to as bulk donor concentration) of the bulk donor. This allows a local N type region to be easily formed. In addition, by setting the range of hydrogen ions large, the passed-through region is allowed to be large in the Z axis direction. In this case, a high concentration region having a donor concentration higher than the bulk donor can be formed in a wider range. Normally, the semiconductor substrate 10 having a predetermined bulk donor concentration needs to be prepared in accordance with characteristics of an element to be formed in the semiconductor substrate 10, particularly a rated voltage or a breakdown voltage. In contrast, if a passed-through region is formed in a large portion, the donor concentration of the semiconductor substrate 10 can be adjusted by controlling the dose amount of hydrogen ions. Therefore, the semiconductor device 100 can be manufactured using a semiconductor substrate having a bulk donor concentration not corresponding to the characteristics and the like of the element. The variation in the bulk donor concentration during the manufacture of the semiconductor substrate 10 is relatively large, but the dose amount of hydrogen ions can be controlled with relatively high precision. Therefore, the concentration of lattice defects occurring by implanting hydrogen ions can also be controlled with high precision, and the donor concentration of the passed-through region can be controlled with high precision.

Figure 2:
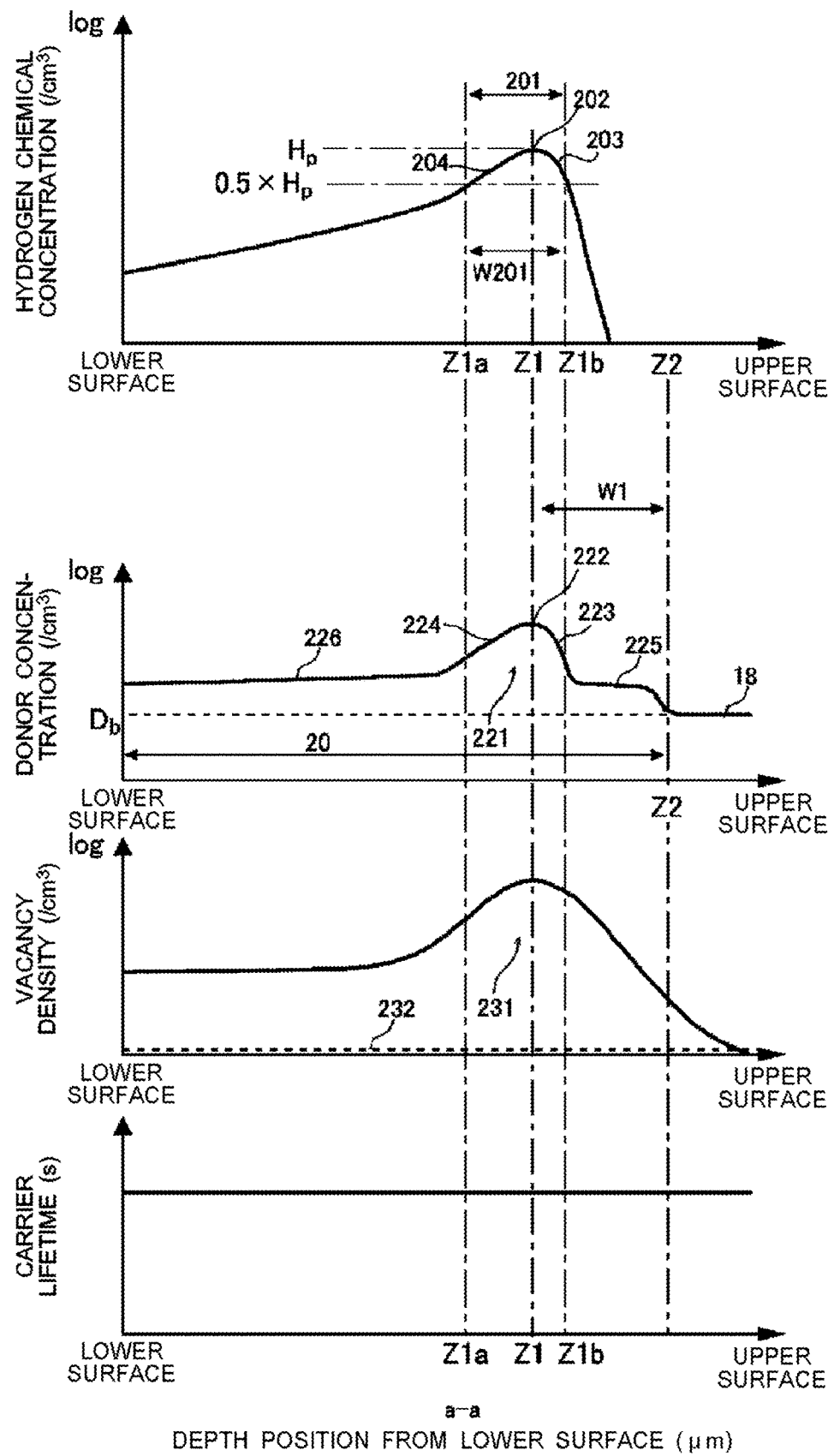
FIG. 2 shows example distributions of a hydrogen chemical concentration, a donor concentration, a vacancy density, and a carrier lifetime in the depth direction at a position shown the line a-a of FIG. 1.

FIG. 2 shows example distributions of a hydrogen chemical concentration, a donor concentration, a vacancy density, and a carrier lifetime in the depth direction at a position shown the line a-a of FIG. 1. The donor concentration of this example is the concentration of a hydrogen donor and a bulk donor. FIG. 2 shows each distribution after hydrogen ions have been implanted to the depth position Z1 and annealing has been performed.

The horizontal axis of FIG. 2 represents depth positions from the lower surface 23, and the vertical axis represents a chemical concentration or a density per unit volume by a logarithmic axis. However, the vertical axis of the graph the carrier lifetime represents time (seconds). The chemical concentration in FIG. 2 is measured by, for example, the SIMS method. The donor concentration is measured by, for example, the SRP method. A carrier density of an N type region measured in the SRP method may be used as the donor concentration. In FIG. 2, a bulk donor concentration $D_b$ is shown by a dashed line. The bulk donor concentration $D_b$ may be uniform over the entire semiconductor substrate 10. The semiconductor substrate 10 of this example is an MCZ substrate, by way of example.

At the depth position Z1 of the semiconductor substrate 10, a hydrogen peak 201 is provided. The hydrogen peak 201 is a peak of the hydrogen chemical concentration distribution in the depth direction. The hydrogen peak 201 has a local maximum 202, an upper tail 203, and a lower tail 204. The local maximum 202 is a point at which the hydrogen chemical concentration shows a local maximum value. Assume that the depth position of the local maximum 202 is Z1. The lower tail 204 is a slope in which the hydrogen chemical concentration decreases in a direction from the local maximum 202 toward the lower surface 23 of the semiconductor substrate 10. The upper tail 203 is a slope in which the hydrogen chemical concentration decreases in a direction from the local maximum 202 toward the upper surface 21 of the semiconductor substrate 10. In this example, because hydrogen ions have been implanted from the lower surface 23, relatively many hydrogen ions exist between the local maximum 202 and the lower surface 23. The upper tail 203 may have the hydrogen chemical concentration decreasing more steeply than the lower tail 204.

In this example, hydrogen ions are implanted to the depth position Z1 from the lower surface 23. As described above, the distance Z1 from the lower surface 23 to the depth position Z1 is 25 μm or more. The distance Z1 may be 30 μm or more, may be 40 μm or more, may be 50 μm or more, may be 60 μm or more, may be 70 μm or more, and may be 80 μm or more. The distance Z1 may be 25% or more, may be 30% or more, may be 40% or more, may be 50% or more, may be 60% or more, may be 70% or more, and may be 80% or more of the thickness of the semiconductor substrate 10. The distance Z1 is smaller than 100% of the thickness of the semiconductor substrate 10. The distance Z1 may be 90% or less and may be 80% or less of the thickness of the semiconductor substrate 10.

In addition, to the depth position Z1, hydrogen ions are preferably implanted in a dose amount of a predetermined value or more. It is experimentally confirmed that by setting the dose amount at a predetermined value or more, a hydrogen donor can be more easily formed on the upper surface 21 side relative to the depth position Z1. The dose amount of hydrogen ions implanted to the depth position Z1 may be $1\times10^{12}$ ions/cm$^2$ or more. The dose amount may be larger than $1\times10^{12}$ ions/cm$^2$, may be $1.5\times10^{12}$ ions/cm$^2$ or more, may be $2\times10^{12}$ ions/cm$^2$ or more, and may be $3\times10^{12}$ ions/cm$^2$ or more. The dose amount may be $1\times10^{15}$ ions/cm$^2$ or less, may be $1\times10^{14}$ ions/cm$^2$ or less, and may be $1\times10^{13}$ ions/cm$^2$ or less.

In addition, a hydrogen chemical concentration $H_p$ at a local maximum 202 of the hydrogen peak 201 may be $8\times10^{15}$ atoms/cm$^3$ or more, may be $1.2\times10^{16}$ atoms/cm$^3$ or more, may be $1.6\times10^{16}$ atoms/cm$^3$ or more, and may be $2.4\times10^{16}$ atoms/cm$^3$ or more. The hydrogen chemical concentration $H_p$ may be $8\times10^{18}$ atoms/cm$^3$ or less, may be $8\times10^{17}$ atoms/cm$^3$ or less, and may be $8\times10^{16}$ atoms/cm$^3$ or less.

It is noted that, as a dose amount of a peak of impurities such as hydrogen, a value obtained by integrating chemical concentrations of the impurities for a range of the full width at half maximum of the peak in the depth direction may be used. Alternatively, a value obtained by multiplying the peak concentration of the peak by the full width at half maximum may be used as the dose amount of the peak of impurities such as hydrogen. Meanwhile, a width of values being 10% of the peak concentration of the peak is defined as a 10% full width. For the dose amount of the peak of impurities such as hydrogen, a value obtained by integrating the chemical concentrations of the impurities for a range of the 10% full width of the peak in the depth direction may be used. In the example of FIG. 2, a value obtained by integrating hydrogen chemical concentrations for a range of a full width at half maximum W201 of the hydrogen peak 201 may be used as the dose amount of hydrogen of the hydrogen peak 201. In the example of FIG. 2, assume that the lower end position of the full width at half maximum W201 is Z1a, and the upper end position of the full width at half maximum W201 is Z1b.

By implanting hydrogen ions to the semiconductor substrate 10 to perform annealing, a hydrogen donor is formed in a passed-through region from the lower surface 23 to the vicinity of the depth position Z1. In addition, by setting the depth position Z1 at 25 μm or more, the acceleration energy of hydrogen ions is increased, and a hydrogen donor is formed on the upper surface 21 side relative to the depth position Z1. This enables a high concentration region 20 to be formed, from the lower surface 23 to a depth position Z2, having a donor concentration higher than the bulk donor concentration $D_b$. The depth position Z2 is a position on the upper surface 21 side relative to the depth position Z1. Assume that the width from the depth position Z1 to the depth position Z2 in the depth direction is W1. By setting the depth position Z1 at 25 μm or more, an extension width W1 of the high concentration region 20 extending toward the upper surface 21 side relative to the depth position Z1 is allowed to be larger. The extension width W1 of this example is 4 μm or more. The extension width W1 may be 8 μm or more, may be 12 μm or more, and may be 16 μm or more. The extension width W1 can be adjusted by the acceleration energy and the dose amount of hydrogen ions implanted to the depth position Z1.

The high concentration region 20 includes a position overlapping with the hydrogen peak 201 in the depth direction of the semiconductor substrate 10. In other words, the high concentration region 20 includes at least a part of the range of the full width at half maximum W201 of the hydrogen peak 201. In a region from the lower surface 23 to the depth position Z1b, the donor concentration distribution may have a shape corresponding to the hydrogen chemical concentration distribution. For example, the donor concentration distribution may have a donor concentration peak 221 at a position overlapping with the hydrogen peak 201.

The donor concentration peak 221 has a local maximum 222, an upper tail 223, and a lower tail 224. The local maximum 222 is a point at which the donor concentration shows a local maximum value. The depth position of the local maximum 222 may be Z1. The lower tail 224 is a slope in which the donor concentration decreases in a direction from the local maximum 222 toward the lower surface 23 of the semiconductor substrate 10. The upper tail 223 is a slope in which the donor concentration decreases in a direction from the local maximum 222 toward the upper surface 21 of the semiconductor substrate 10. The upper tail 223 may have the donor concentration decreasing more steeply than the lower tail 224.

In addition, the donor concentration distribution has a lower side flat portion 226 arranged on the lower surface 23 side relative to the donor concentration peak 221, and an upper side flat portion 225 arranged on the upper surface 21 side relative to the donor concentration peak 221. Each flat portion has an approximately constant donor concentrations in the depth direction. Being approximately constant is a state, for example, in which the range of the variation of donor concentration is within ±50%. The length of the upper side flat portion 225 in the depth direction may be 1 μm or more, may be 2 μm or more, may be 4 μm or more, may 8 μm or more, may be 12 μm or more, and may be 16 μm or more. On the upper surface 21 side relative to the upper side flat portion 225, a drift region 18 may be provided. The drift region 18 is a region in which the doping concentration in the depth direction is approximately constant. The doping concentration of the drift region 18 may be the bulk donor concentration Db, and may be higher than the bulk donor concentration Db.

The vacancy density distribution may have a vacancy density peak 231. The vacancy density distribution of this example is a density distribution including both vacancy defects functioning as hydrogen donors and vacancy defects not functioning as hydrogen donors. The vacancy density distribution of this example is approximately similar to a vacancy density distribution after hydrogen ion implantation and before annealing. It is noted that a distribution 232 of a vacancy density of vacancies having remained after annealing, without becoming hydrogen donors, is shown by a dashed line. By implanting hydrogen ions at high acceleration energy, the vacancy density can be more easily distributed on the upper surface 21 side relative to the depth position Z1. This enables the extension width W1 of the high concentration region 20 to be large. In addition, by enlarging the extension width W1, the steep decrease of the donor concentration on the upper surface 21 side relative to the depth position Z1 can be suppressed. This can improve the characteristics of the semiconductor device 100 when a depletion layer reaches the vicinity of the depth position Z1. It is noted that the carrier lifetime distribution of this example does not have a distinct peak at the depth position Z1. The concentration of the vacancy density distribution 232 as a distribution of the vacancy density of vacancies having remained after annealing without becoming donors may be substantially 0, and the vacancy density distribution 232 may be substantially flat.

Figure 3:
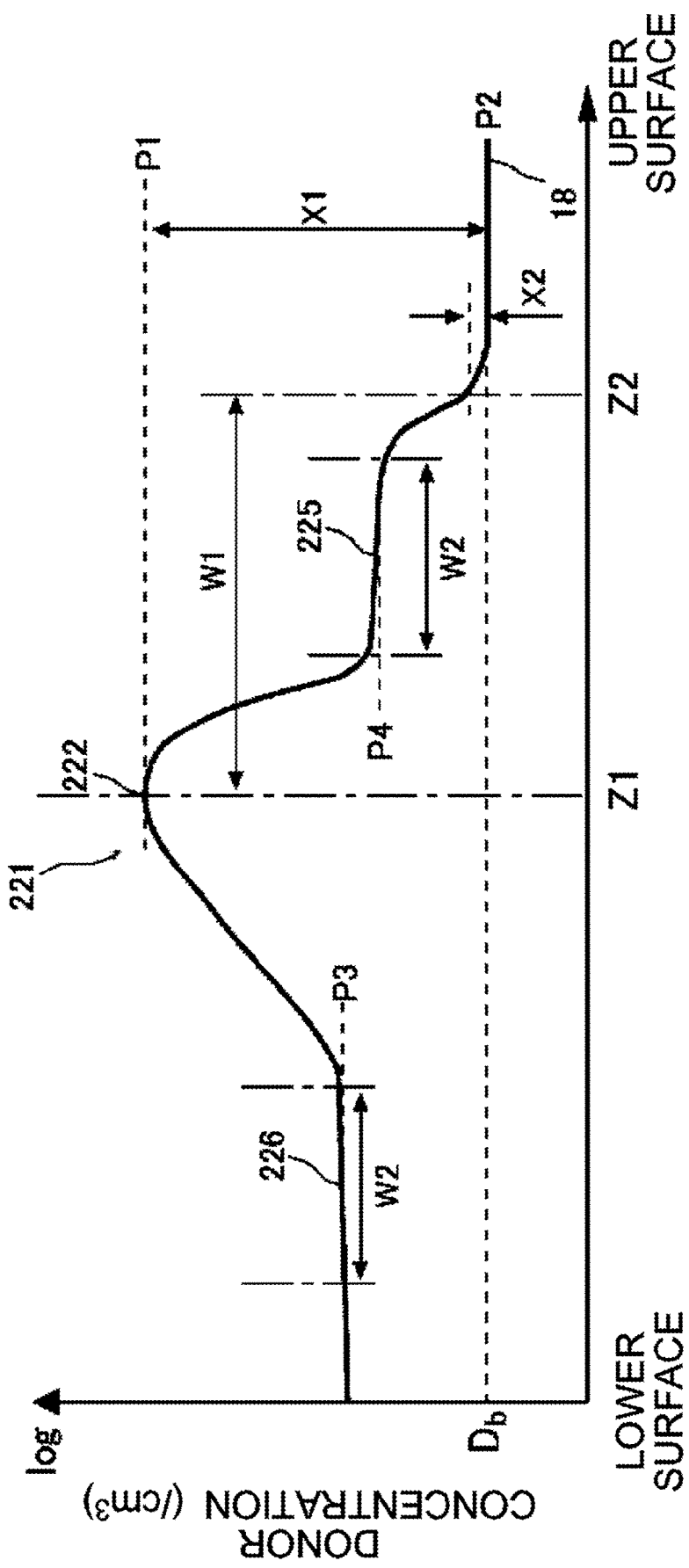
FIG. 3 illustrates an enlarged view of the donor concentration distribution in the vicinity of the donor concentration peak 221.

FIG. 3 illustrates an enlarged view of the donor concentration distribution in the vicinity of the donor concentration peak 221. In this example, assume that the donor concentration at the local maximum 222 of the donor concentration peak 221 is P1, the donor concentration at the drift region 18 is P2, and the difference between donor concentrations P1 and P2 (that is, P1−P2) is ×1. In addition, assume that 5% of the difference between donor concentrations P1 and P2 (that is, 0.05×(P1−P2)) is X2.

In this example, assume that the position at which a donor concentration first becomes P2+×2 in a direction from the local maximum 222 toward the upper surface 21 is a depth position Z2. As described above, the depth position Z2 is an upper end position of the high concentration region 20. The extension width W1 of the high concentration region 20 is a distance between the depth position Z2 and the depth position Z1.

In addition, assume that a region, between the depth position Z1 and the depth position Z2, having a width W2 in the depth direction being the maximum among regions having the range of the variation of donors within ±50% of the average value is an upper side flat portion 225. Assume that the average value of the donor concentrations in the region is a donor concentration P4 of the upper side flat portion 225.

Assume that a region, between the depth position Z1 and the lower surface 23, having the range of the variation of donors within ±50% of the average value throughout the width W2 and closest to the depth position Z1 is a lower side flat portion 226. Assume that the average value of the donor concentration of the region is a donor concentration P3 of the lower side flat portion 226. The donor concentration P4 may be 0.5 times or more and twice or less the donor concentration P3. In other words, the donor concentration P4 of the upper side flat portion 225 and the donor concentration P3 of the lower side flat portion 226 are approximately the same. The donor concentration P4 may be 0.7 times or more, and may be 0.9 times or more the donor concentration P3. The donor concentration P4 may be 1.3 times or less, and may be 1.1 times or less the donor concentration P3.

Figure 4A:
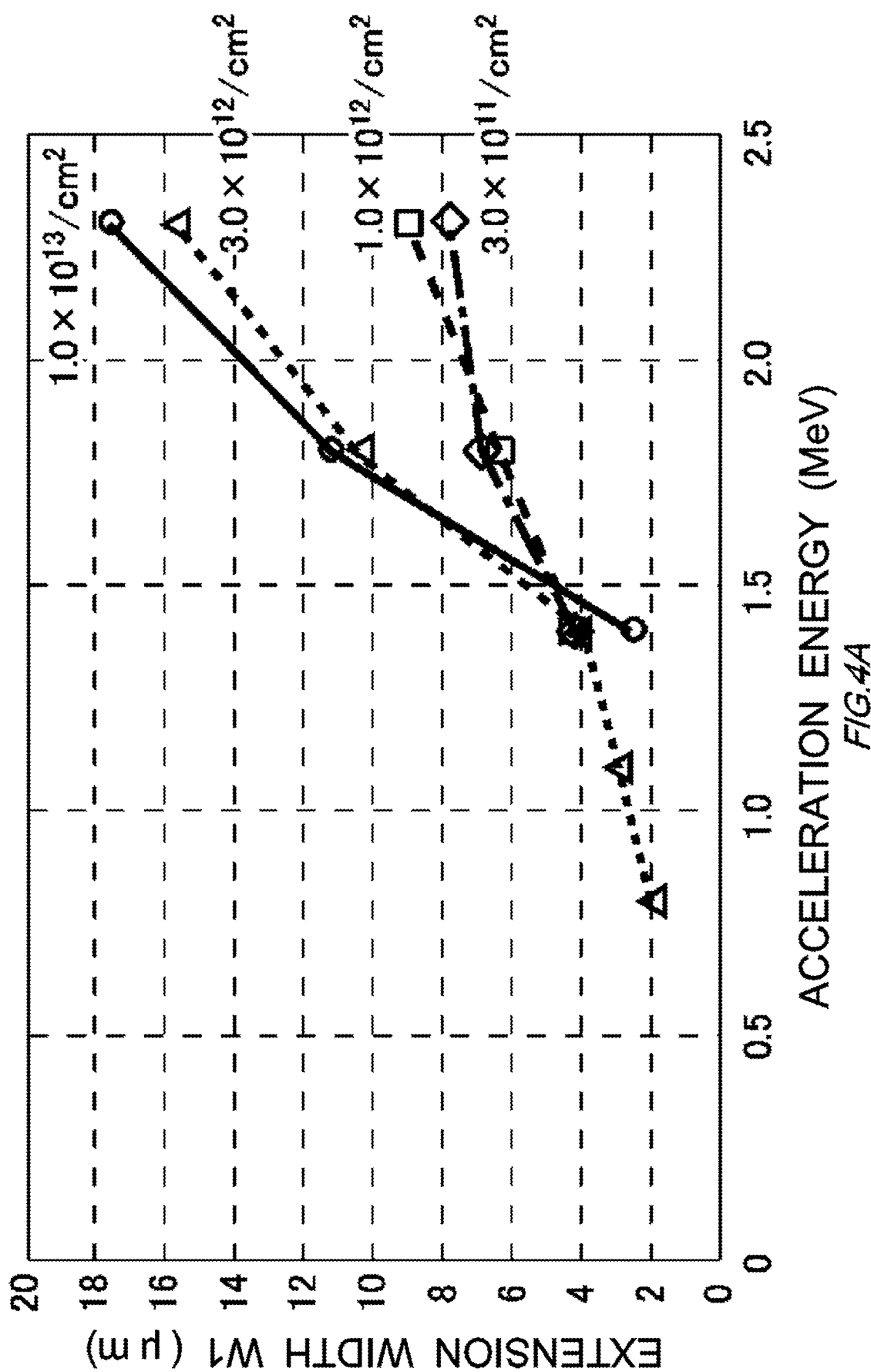
FIG. 4A illustrates a measured result of measuring the relationship between the extension width W1 of the high concentration region 20 and the acceleration energy of hydrogen ions.

FIG. 4A illustrates a measured result of measuring the relationship between the extension width W1 of the high concentration region 20 and the acceleration energy of hydrogen ions. In this example, the acceleration energy of hydrogen ions implanted to the depth position Z1 is changed in a range of 0.8 MeV to 2.3 MeV to measure the extension width W1 in the high concentration region 20 to be formed. In addition, the dose amount of hydrogen ions are changed in a range of $3.0 \times 10^{11}$ ions/cm² to $1.0 \times 10^{13}$ ions/cm². It is noted that annealing has been performed for five hours at 350 degrees C. after implanting hydrogen ions.

Figure 4B:
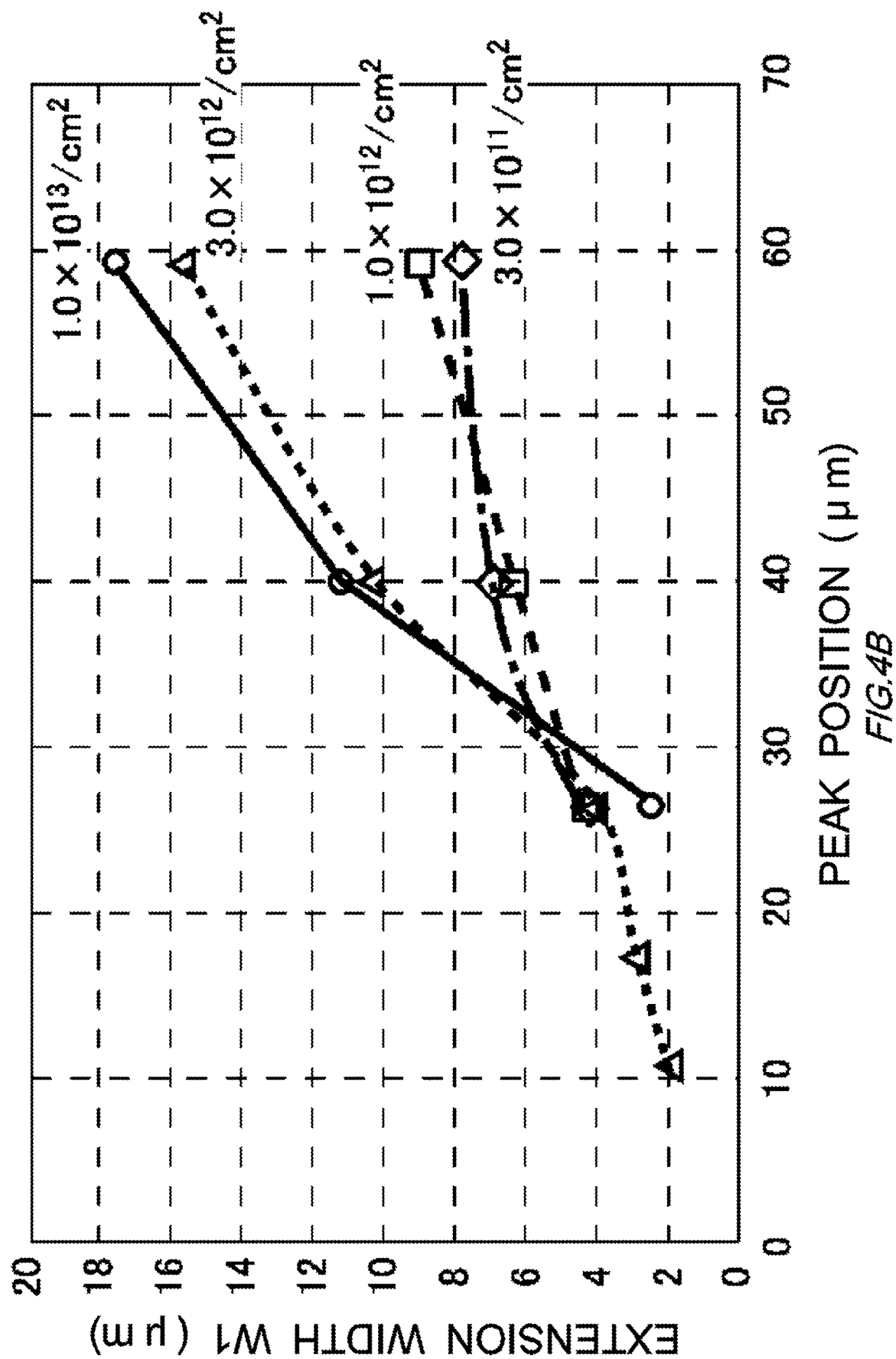
FIG. 4B is identical to FIG. 4A except for having a peak position as a range of hydrogen ions implanted at the acceleration energy instead of the acceleration energy of hydrogen ions.

FIG. 4B is identical to FIG. 4A except for having a peak position as a range of hydrogen ions implanted at the acceleration energy instead of the acceleration energy of hydrogen ions. In this example, acceleration energy of 1.4 MeV corresponds to a peak position of 24 µm, acceleration energy of 1.8 MeV corresponds to a peak position of 40 µm, and acceleration energy of 2.3 MeV corresponds to a peak position of 58 µm.

Figure 5:
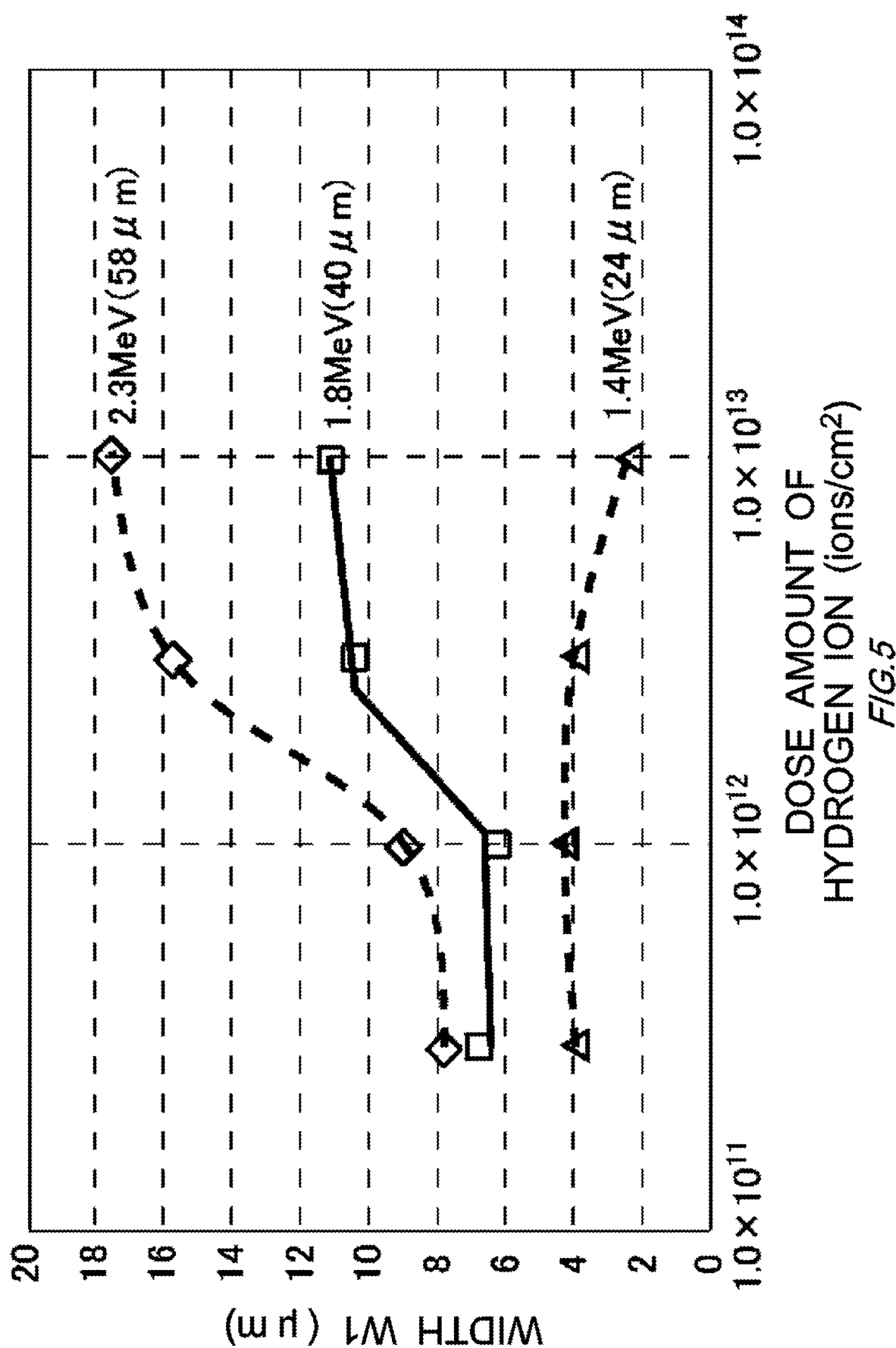
FIG. 5 illustrates the relationship between the extension width W1 of the high concentration region 20 and a dose amount of hydrogen ions.

FIG. 5 illustrates the relationship between the extension width W1 of the high concentration region 20 and a dose amount of hydrogen ions. In FIG. 5, the relationship between the extension width W1 and the dose amount for each of the acceleration energies of hydrogen ions are shown. Although the acceleration energy of 2.3 MeV, 1.8 MeV, and 1.4 MeV are illustrated as examples in FIG. 5, the tendency observed when the acceleration energy is smaller than 1.4 MeV is similar to that observed when the acceleration energy is 1.4 MeV.

As shown in FIG. 4A, a tendency has been observed that when the acceleration energy of hydrogen ion is larger than 1.4 MeV, the extension width W1 of the high concentration region 20 becomes particularly large. The acceleration energy of hydrogen ions may be larger than 1.4 MeV, may be 1.41 MeV or more, may be 1.5 MeV or more, may be 1.8 MeV or more, and may be 2.0 MeV or more.

As shown in FIG. 4B, it has been observed that particularly when the peak position of hydrogen ions is larger than 24 µm, the extension width W1 of the higher concentration region 20 tends to be large. The acceleration energy of hydrogen ions may be larger than 24 µm, may be 25 µm or more, may be 30 µm or more, may be 40 µm or more, may be 50 µm or more, and may be 60 µm or more.

As shown in FIG. 4A, FIG. 4B, and FIG. 5, when the dose amount of hydrogen ions is $1.0 \times 10^{12}$ ions/cm² or more, the extension width W1 is allowed to become large more easily. Particularly, when the dose amount of hydrogen ions is $3.0 \times 10^{12}$ ions/cm² or more, the increase of the extension width W1 is significant. The dose amount of hydrogen ion may be larger than $1.0 \times 10^{12}$ ions/cm², may be $1.0 \times 10^{12}$ ions/cm² or more, may be $1.5 \times 10^{12}$ ions/cm² or more, may be $2.0 \times 10^{12}$ ions/cm² or more, and may be $3.0 \times 10^{12}$ ions/cm² or more.

Particularly, as shown in FIG. 5, the width W1 decreases while the dose amount increases when the acceleration energy is 1.4 MeV or less (the peak position is 24 µm or less), and the width W1 critically increases while the dose amount increases when the acceleration energy is larger than 1.4 MeV (when the peak position is larger than 24 µm). Therefore, the width W1 has a characteristic that the manner of the increase and decrease critically varies when the acceleration energy of hydrogen ions is larger than 1.4 MeV or when the or peak position is larger than 24 µm.

Figure 6:
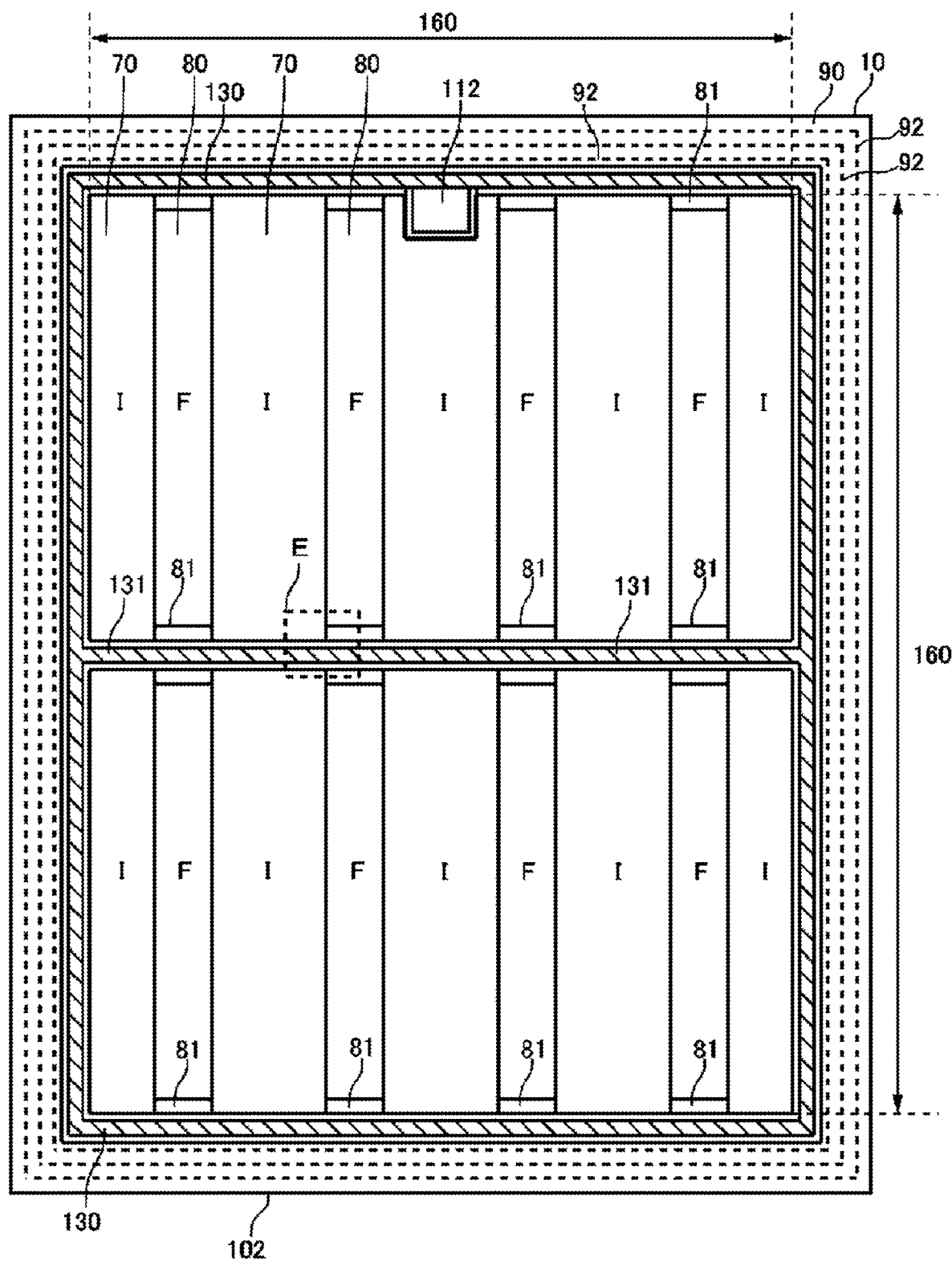
FIG. 6 is one example top view of the semiconductor device 100.
Figure 6:
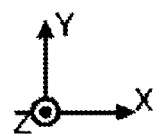

FIG. 6 is one example top view of the semiconductor device 100. In FIG. 6, a position at which each member is projected on the upper surface of the semiconductor substrate 10 is shown. In FIG. 6, only some members of the semiconductor device 100 are illustrated, and other members are omitted.

The semiconductor device 100 includes the semiconductor substrate 10 described in FIG. 1 to FIG. 5. The semiconductor substrate 10 has an end side 102 in a top view. In the case of simply mentioning "in a top view" in the present specification, it means viewing from the upper surface side of the semiconductor substrate 10. The semiconductor substrate 10 of this example includes two sets of end sides 102 facing each other in a top view. In FIG. 6, each of the X axis and the Y axis is parallel to any of the end sides 102. In addition, the Z axis is perpendicular to the upper surface of the semiconductor substrate 10.

The semiconductor substrate 10 is provided with an active portion 160. The active portion 160 is a region in which main current flows in the depth direction between the upper surface and the lower surface of the semiconductor substrate 10 when the semiconductor device 100 operates. Although an emitter electrode is provided above the active portion 160, it is omitted in FIG. 6.

In the active portion 160 of this example, a transistor portion 70 including an IGBT, and a diode portion 80 including a diode element such as an FWD are provided. In the example of FIG. 6, the transistor portion 70 and the diode portion 80 are arranged alternately, along a predetermined array direction (the X axis direction in this example) on the upper surface of the semiconductor substrate 10. In another example, only the transistor portion 70 may be provided in the active portion 160.

In FIG. 6, a region where the transistor portion 70 is arranged is denoted by a symbol "I", and a region where the diode portion 80 is arranged is denoted by a symbol F. In the present specification, a direction perpendicular to the array direction in a top view may be referred to as an extending direction (Y axis direction in FIG. 6). The transistor portion 70 and the diode portion 80 may each have a longitudinal side in the extending direction. In other words, the length of the transistor portion 70 in the Y axis direction is larger than the width in the X axis direction. Similarly, the length of the diode portion 80 in the Y axis direction is larger than the width in the X axis direction. The extending direction of the transistor portion 70 and the diode portion 80 and the longitudinal direction of each trench portion described later may be the same.

The diode portion 80 includes an N+ type cathode region in a region in contact with the lower surface of the semiconductor substrate 10. In the present specification, the region where the cathode region is provided is referred to as the diode portion 80. In other words, the diode portion 80 is a region overlapping with the cathode region in a top view. In the lower surface of the semiconductor substrate 10, a P+ type collector region may be provided in regions other than the cathode region. In the present specification, the diode portion 80 may also include an extension region 81 where the diode portion 80 extends to a gate runner described later in the Y axis direction. In the lower surface of the extension region 81, a collector region is provided.

The transistor portion 70 includes a P+ type collector region in a region in contact with the lower surface of the semiconductor substrate 10. In addition, in the transistor portion 70, there is periodically arranged a gate structure, which includes an N type emitter region, a P type base region, a gate conductive portion, and a gate dielectric film, on the upper surface side on the semiconductor substrate 10.

The semiconductor device 100 may have one or more pads above the semiconductor substrate 10. The semiconductor device 100 of this example has a gate pad 112. The semiconductor device 100 may include pads such as an anode pad, a cathode pad, and a current detection pad. Each pad is arranged in the vicinity of the end side 102. The vicinity of the end side 102 refers to a region between the end side 102 and the emitter electrode, in a top view. When mounting the semiconductor device 100, each pad may be connected to an external circuit via a wiring such as a wire.

A gate potential is applied to the gate pad 112. The gate pad 112 is electrically connected to the conductive portion of the gate trench portion of the active portion 160. The semiconductor device 100 includes a gate runner connecting the gate pad 112 and the gate trench portion. In FIG. 6, the gate runner is hatched with diagonal lines.

The gate runner of this example includes an outer circumferential gate runner 130 and an active-side gate runner 131. The outer circumferential gate runner 130 is arranged between the active portion 160 and the end side 102 of the semiconductor substrate 10, in a top view. The outer circumferential gate runner 130 of this example encloses the active portion 160 in a top view. The region enclosed by the outer circumferential gate runner 130 in a top view may be called the active portion 160. In addition, the outer circumferential gate runner 130 is connected to the gate pad 112. The outer circumferential gate runner 130 is arranged on the upper side of the semiconductor substrate 10. The outer circumferential gate runner 130 may be a metal wiring containing aluminum or the like.

The active-side gate runner 131 is provided in the active portion 160. Providing the active-side gate runner 131 in the active portion 160 allows the variation in the wiring length from the gate pad 112 to be reduced for each region of the semiconductor substrate 10.

The active-side gate runner 131 is connected to the gate trench portion of the active portion 160. The active-side gate runner 131 is arranged on the upper side of the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided to extend in the X axis direction from one outer circumferential gate runner 130 to the other outer circumferential gate runner 130 in the substantial center of the Y axis direction so as to cross the active portion 160. In a case where the active portion 160 is divided by the active-side gate runner 131, the transistor portion 70 and the diode portion 80 may be alternately arranged in the X axis direction in each divided region.

In addition, the semiconductor device 100 may include a temperature sensing portion (not shown) which is a PN junction diode formed of polysilicon or the like, and a current detection portion (not shown) which simulates the operation of the transistor portion provided in the active portion 160.

The semiconductor device 100 of this example includes an edge termination structure portion 90 between the active portion 160 and the end side 102. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 includes a plurality of guard rings 92. The guard ring 92 is a P type region in contact with the upper surface of the semiconductor substrate 10. The active portion 160 may be enclosed by the guard ring 92 in a top view. Between the outer circumferential gate runner 130 and the end side 102, the plurality of guard rings 92 are arranged at predetermined intervals. A guard ring 92 arranged on an outer side may enclose a guard ring 92 arranged further inward. The outer side refers to a side close to the end side 102, and the inner side refers to a side close to the outer circumferential gate runner 130. Providing the plurality of guard rings 92 allows the depletion layer on the upper surface side of the active portion 160 to be extended outward and can improve the breakdown voltage of the semiconductor device 100. The edge termination structure portion 90 may further include at least one of a field plate and a RESURF annularly provided to enclose the active portion 160.

Figure 7:
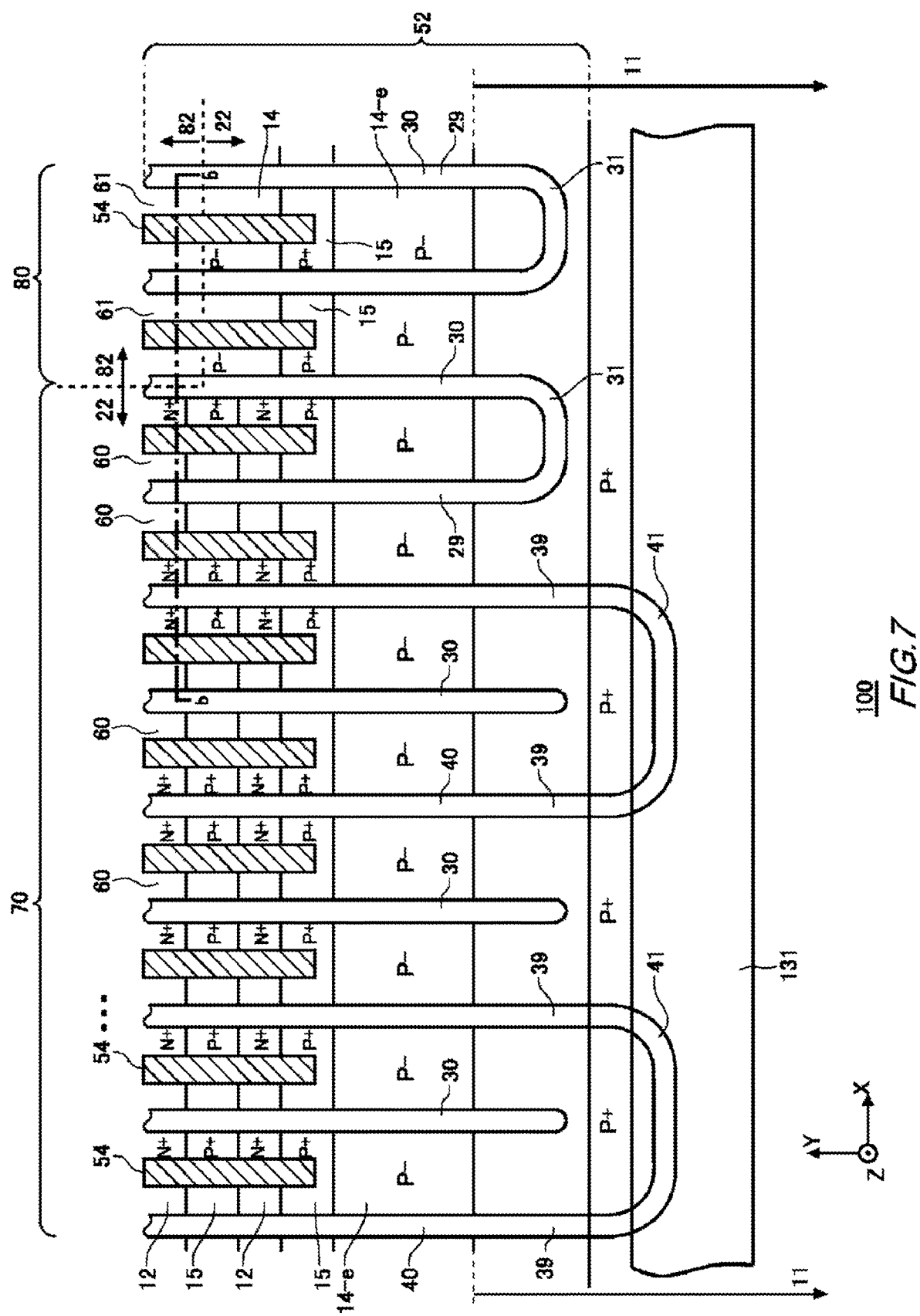
FIG. 7 illustrates an enlarged view of a region E of FIG. 5.

FIG. 7 illustrates an enlarged view of a region E of FIG. 6. The region E includes a transistor portion 70, a diode portion 80, and an active-side gate runner 131. The semiconductor device 100 of this example includes a gate trench portion 40, a dummy trench portion 30, a well region 11, an emitter region 12, a base region 14, and a contact region 15, which are provided inside on the upper surface side of the semiconductor substrate 10. The gate trench portion 40 and the dummy trench portion 30 each are an example of the trench portion. In addition, the semiconductor device 100 of this example includes an emitter electrode 52 and the active-side gate runner 131 which are provided on the upper side of the upper surface of the semiconductor substrate 10. The emitter electrode 52 and the active-side gate runner 131 are provided to be separated from each other.

Although an interlayer dielectric film is provided between the emitter electrode 52 and active-side gate runner 131 and the upper surface of the semiconductor substrate 10, it is omitted in FIG. 7. In the interlayer dielectric film of this example, a contact hole 54 is provided to pass through the interlayer dielectric film. In FIG. 7, each contact hole 54 is hatched with diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 7 shows a range in which an emitter electrode 52 is provided. For example, at least a part of a region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in the lower layer of the region formed of aluminum or the like. Further, in the contact hole, a plug formed with tungsten or the like buried therein may be included to be in contact with the barrier metal, aluminum, or the like.

The well region 11 is provided to be overlapped with the active-side gate runner 131. The well region 11 is provided to extend with a predetermined width even in a range where the active-side gate runner 131 is not overlapped. The well region 11 of this example is provided to be separated from the end of the contact hole 54 in the Y axis direction toward the active-side gate runner 131 side. The well region 11 is a second conductivity type region in which its doping concentration is higher than that of the base region 14. The base region 14 in this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 (trench portions that are linear along the extending direction) extending along the extending direction perpendicular to the array direction, and the edge portion 41 for connecting the two linear portions 39. The extending direction in FIG. 7 is the Y axis direction.

At least a part of the edge portion 41 is preferably provided in a curved shape in a top view. The end portions of two linear portions 39 in the Y axis direction are connected by the edge portion 41, so that the electric field strength in the end portion of the linear portion 39 can be reduced.

In the transistor portion 70, the dummy trench portion 30 is provided between the respective linear portions 39 of the gate trench portion 40. Between the respective linear portions 39, one dummy trench portion 30 may be provided, or a plurality of dummy trench portions 30 may be provided. The dummy trench portion 30 may be in a linear shape extending in the extending direction, or may include a linear portion 29 and an edge portion 31 similarly to the gate trench portion 40. The semiconductor device 100 shown in FIG. 7 includes both a linear dummy trench portion 30 not having an edge portion 31, and a dummy trench portion 30 having the edge portion 31.

A diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. In other words, the bottom of each trench portion in the depth direction is covered with the well region 11 at the end portion of each trench portion in the Y axis direction. With this configuration, the electric field strength in the bottom of each trench portion can be reduced.

A mesa portion is provided between respective trench portions in the array direction. The mesa portion indicates a region sandwiched between the trench portions in the semiconductor substrate 10. By way of example, the upper end of the mesa portion is the upper surface of the semiconductor substrate 10. The depth position of the lower end of the mesa portion is the same as the depth position of the lower end of the trench portion. The mesa portion of this example is provided to extend in the extending direction (Y axis direction) along the trench, in the upper surface of the semiconductor substrate 10. In this example, a mesa portion 60 is provided in the transistor portion 70, and a mesa portion 61 is provided in the diode portion 80. The "mesa portion" simply mentioned in the present specification refers to each of the mesa portion 60 and the mesa portion 61.

Each mesa portion is provided with the base region 14. Assume that a region arranged closest to the active-side gate runner 131 is a base region 14-$e$, in the base region 14 exposed on the upper surface of the semiconductor substrate 10 in the mesa portion. Although the base region 14-$e$ arranged in one end portion of each mesa portion in the extending direction is shown in FIG. 7, the base region 14-$e$ is also arranged in the other end portion of each mesa portion. In each mesa portion, at least one of the first conductivity type emitter region 12 and the second conductivity type contact region 15 may be provided in the region sandwiched between the base regions 14-$e$ in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. By way of example, the contact region 15 and the emitter region 12 of the mesa portion 60 are alternately arranged along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on the upper surface of the mesa portion 61. The contact region 15 may be provided in contact with each of the base regions 14-$e$ in a region sandwiched between the base regions 14-$e$ on the upper surface of the mesa portion 61. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in a region sandwiched between the base regions 14-e. The contact hole 54 of this example is provided above each region of the contact region 15, the base region 14, and the emitter region 12. The contact hole 54 is not provided in a region corresponding to the base region 14-e and the well region 11. The contact hole 54 may be arranged at the center in the array direction (X axis direction) of the mesa portion 60.

In the diode portion 80, an N+ type cathode region 82 is provided in a region adjacent to the lower surface of the semiconductor substrate 10. On the lower surface of the semiconductor substrate 10, a P+ type collector region 22 may be provided in a region where the cathode region 82 is not provided. In FIG. 7, a boundary between the cathode region 82 and the collector region 22 is indicated by a dotted line.

The cathode region 82 is arranged away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 of this example in the Y axis direction is arranged farther from the well region 11 than the end portion of the contact hole 54 in the Y axis direction. In another example, the end portion of the cathode region 82 in the Y axis direction may be arranged between the well region 11 and the contact hole 54.

Figure 8:
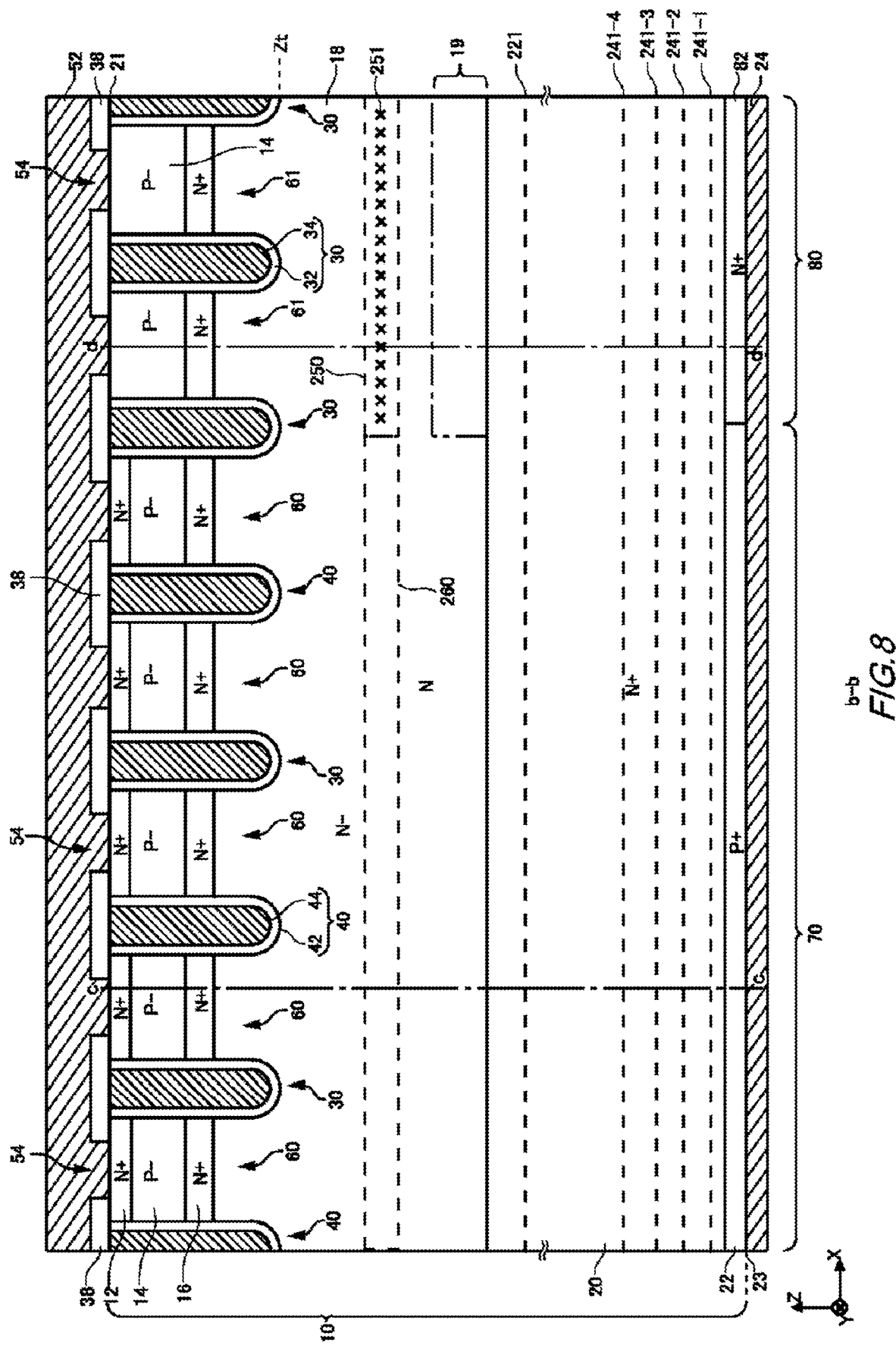
FIG. 8 illustrates one example of a cross section b-b in FIG. 6.

FIG. 8 illustrates one example of a cross section b-b in FIG. 7. The cross section b-b is an XZ plane passing through the emitter region 12 and the cathode region 82. The semiconductor device 100 of this example includes the semiconductor substrate 10, an interlayer dielectric film 38, the emitter electrode 52, and a collector electrode 24 in the cross section. The interlayer dielectric film 38 is provided on the upper surface of the semiconductor substrate 10. The interlayer dielectric film 38 is a film including at least one of a dielectric film such as silicate glass to which an impurity such as boron or phosphorus is added, a thermal oxide film, and other dielectric films. The interlayer dielectric film 38 is provided with the contact hole 54 described in FIG. 7.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction (Z axis direction) connecting the emitter electrode 52 and the collector electrode 24 is referred to as a depth direction.

The semiconductor substrate 10 has an N− type drift region 18. The doping concentration of the drift region 18 may be identical to the bulk donor concentration. In another example, the doping concentration of the drift region 18 may be higher than the bulk donor concentration. The drift region 18 is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The drift region 18 is provided below the base region 14. The mesa portion 60 may be provided with an N+ type accumulation region 16. The accumulation region 16 is arranged between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high-concentration accumulation region 16 between the drift region 18 and the base region 14, the carrier injection enhancement effect (IE effect) can be increased, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type high concentration region 20 is provided on the lower surface 23 side relative to the drift region 18. The doping concentration of the high concentration region 20 is higher than the doping concentration of the drift region 18. The high concentration region 20 includes the hydrogen peak 201 and the donor concentration peak 221, described in FIG. 1 to FIG. 5. The high concentration region 20 may have a hydrogen peak other than the hydrogen peak 201, and may have a donor concentration peak 241 other than the donor concentration peak 221. The high concentration region 20 of this example has a plurality of donor concentration peaks 241 arranged on the lower surface 23 side relative to the donor concentration peak 221. The high concentration region 20 may function as a field stopper layer to prevent a depletion layer, which expands from the lower end of the base region 14, from reaching the P+ type collector region 22 and the N+ type cathode region 82.

In the transistor portion 70, the P+ type collector region 22 is provided under the high concentration region 20. The acceptor concentration of the collector region 22 is higher than the acceptor concentration of the base region 14. The collector region 22 may include the same acceptor as the base region 14, and may include a different acceptor. The acceptor of the collector region 22 is, for example, boron.

In diode portion 80 the N+ type cathode region 82 is provided under the high concentration region 20. The donor concentration of the cathode region 82 is higher than the donor concentration of the drift region 18. The donor of the cathode region 82 is, for example, hydrogen or phosphorus. It is noted that elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10 to reach the drift region 18. In the region where at least any one of the emitter region 12, the contact region 15, and the accumulation region 16 is provided, each trench portion also passes through these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion passes through the doping region.

As described above, the transistor portion 70 is provided with the gate trench portion 40 and the dummy trench portion 30. The diode portion 80 is provided with the dummy trench portion 30 and is not provided with the gate trench portion 40. In this example, the boundary between the diode portion 80 and the transistor portion 70 in the X axis direction is the boundary between the cathode region 82 and the collector region 22.

The gate trench portion 40 includes a gate trench, a gate dielectric film 42, and a gate conductive portion 44 provided on the upper surface 21 of the semiconductor substrate 10. The gate trench portion 40 is one example of a gate structure. The gate dielectric film 42 is provided to cover the inner wall of the gate trench. The gate dielectric film 42 may be formed by oxidizing or nitriding the semiconductor in the inner wall of the gate trench. The gate conductive portion 44 is provided inside the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. When a predetermined gate voltage is applied to the gate conductive portion 44, a channel by an inversion layer of electrons is formed in a surface layer of the boundary in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad, not depicted, connected to an external circuit different from the gate pad, and may perform different controlling from the gate conductive portion 44. In addition, the dummy conductive portion 34 may be electrically connected to the emitter electrode 52. The dummy dielectric film 32 is provided to cover the inner wall of the dummy trench. The dummy conductive portion 34 is provided in the dummy trench and is provided inside the dummy dielectric film 32. The dummy dielectric film 32 insulates the dummy conductive portion 34 from the semiconductor substrate 10.

The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 in the upper surface 21 of the semiconductor substrate 10. It is noted that the bottoms of the dummy trench portion 30 and the gate trench portion 40 may have a surface shape convexly downward (a curved shape in a cross section).

The diode portion 80 is arranged on the upper surface 21 side relative to the hydrogen peak 201 (or the donor concentration peak 221) and has a lifetime adjustment portion 250 at which the carrier lifetime distribution shows a local minimum value in the depth direction. The lifetime adjustment portion 250 may be provided over the entire diode portion 80 in the X axis direction. The lifetime adjustment portion 250 has a vacancy density peak 251 of the vacancy density distribution in the depth direction. By providing the lifetime adjustment portion 250, for example, a reverse recovery time period of the diode portion 80 at the time of turn-off of the semiconductor device 100 can be adjusted to reduce turn-off loss.

The lifetime adjustment portion 250 may also be provided in a region in contact with the diode portion 80 among the transistor portions 70. The lifetime adjustment portion 250 may not be arranged below the gate trench portion 40. The lifetime adjustment portion 250 may be arranged up to the lower portion of a gate trench portion 40 located closest to the diode portion 80 side among gate trench portions 40 of the transistor portion 70.

The transistor portion 70 has, at the same depth position as the lifetime adjustment portion 250, a lifetime non-adjustment portion 260 at which the carrier lifetime distribution does not show the local minimum value in the depth direction. The lifetime non-adjustment portion 260 does not have a vacancy density peak 251. Implantation of charged particles such as helium may be performed to form the lifetime adjustment portion 250. The lifetime adjustment portion 250 may contain helium. A helium concentration in the lifetime non-adjustment portion 260 is substantially 0, or a helium concentration in the lifetime adjustment portion 250 is 1% or less. The high concentration region 20 located on the lower surface 23 side of the lifetime adjustment portion 250 may extend on the upper surface 21 side relative to the high concentration region 20 located on the lower surface 23 side of the lifetime non-adjustment portion 260. That is, the high concentration region 20 located on the lower surface 23 side of the lifetime adjustment portion 250 may have a region 19 extending on the upper surface 21 side relative to the high concentration region 20 located on the lower surface 23 side of the lifetime non-adjustment portion 260.

Figure 9:
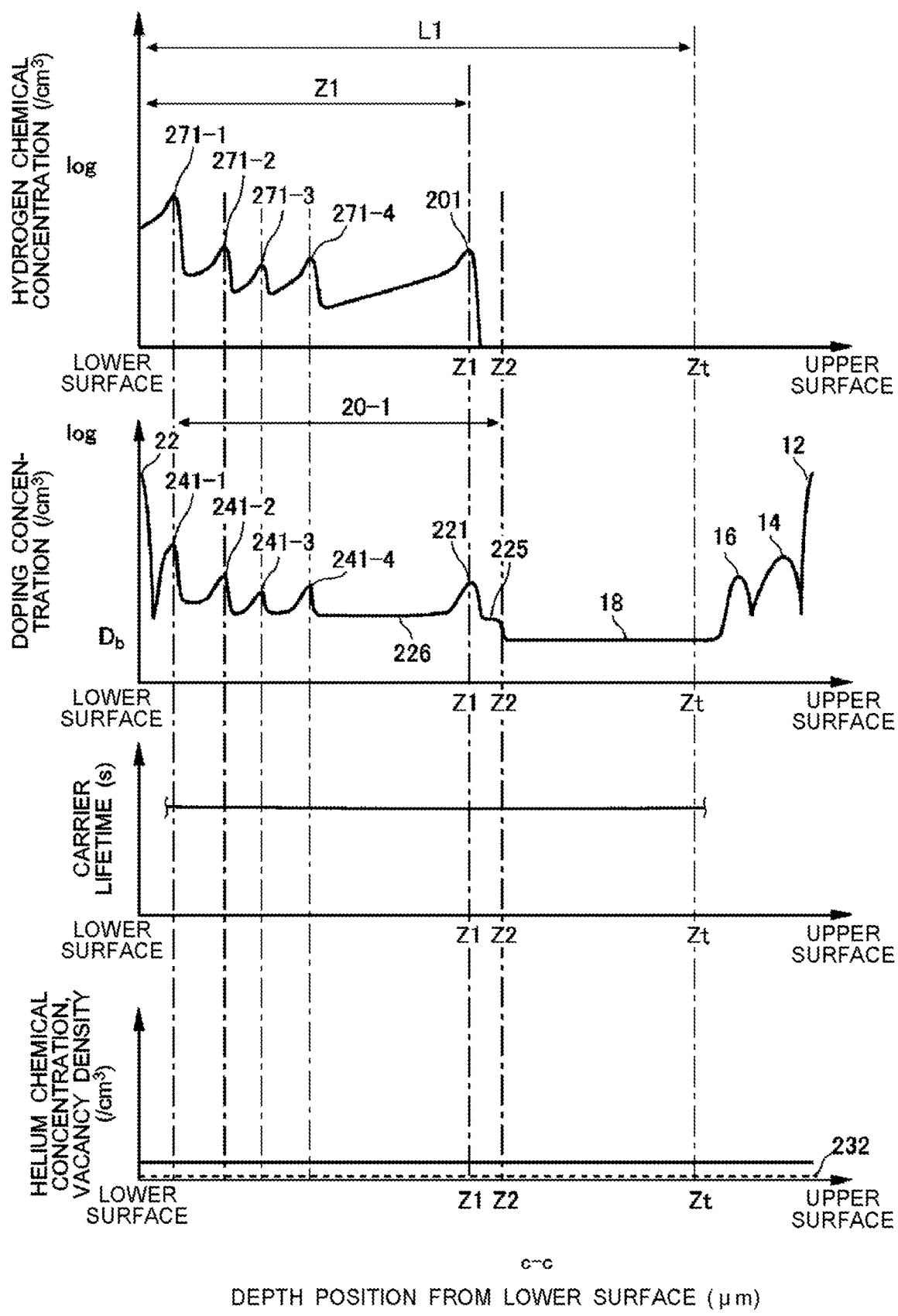
FIG. 9 shows example distributions of the hydrogen chemical concentration, the doping concentration, the carrier lifetime, and the helium chemical concentration in the depth direction at a position shown by a line c-c of FIG. 8.

FIG. 9 shows example distributions of the hydrogen chemical concentration, the doping concentration, the carrier lifetime, the helium chemical concentration and the vacancy density in the depth direction at a position shown by a line c-c of FIG. 8. The line c-c is parallel to the Z axis and passes through the lifetime non-adjustment portion 260 as well. In addition, the high concentration region 20 provided in the transistor portion 70 is referred to as a first high concentration region 20-1.

The first high concentration region 20-1 has the hydrogen peak 201, the donor concentration peak 221, the upper side flat portion 225 and the lower side flat portion 226 described in FIG. 1 to FIG. 5. In addition, the first high concentration region 20-1 of this example has donor concentration peaks 241-1, 241-2, 241-3, and 241-4 on the lower surface 23 side relative to the donor concentration peak 221. Each donor concentration peak 241 is a hydrogen donor peak. The first high concentration region 20-1 of this example has hydrogen peaks 271-1, 271-2, 271-3, and 271-4 on the lower surface 23 side relative to the hydrogen peak 201. Each hydrogen peak 271 may be arranged in the same depth position as a corresponding donor concentration peak 241. Arranging two peaks at the same depth position indicates arranging a local maximum of one peak in a range of the full width at half maximum of the other peak.

A plurality of donor concentration peaks 241 may be arranged on the lower surface 23 side of the semiconductor substrate 10. The plurality of donor concentration peaks 241 may be arranged in a region having a ¼ or less thickness of the semiconductor substrate 10 with respect to the lower surface 23. At least one donor concentration peak 241 may have a donor concentration higher than the donor concentration peak 221. For example, a donor concentration peak 241 arranged closest to the lower surface 23 side may have a donor concentration twice or more, may be 5 times or more, and may be 10 times or more the donor concentration of the donor concentration peak 221. The plurality of donor concentration peaks 241 may include a donor concentration peak 241 having a donor concentration lower than the donor concentration peak 221. One or more donor concentration peaks 241 selected from donor concentration peaks 241 having larger distance from the lower surface 23 may have a donor concentration lower than the donor concentration peak 221. Any of donor concentration peaks 241 may have a donor concentration higher than the upper side flat portion 225.

In addition, assume that the depth position of the lower end of the gate trench portion 40 or the dummy trench portion 30 shown in FIG. 8 is Zt. A charged particle, such as an electron beam or a helium ion, for forming a lifetime killer does not pass through a region overlapping with the lifetime non-adjustment portion 260 in the depth direction and having a depth position from Zt to Z1. Therefore, in the region from the depth position Zt to the depth position Z1, the carrier lifetime may be flat, monotonously increased, or monotonously decreased. That is, the carrier lifetime distribution does not have a valley or a peak in the region. The minimum value of the carrier lifetime in the region from the depth position Zt to the depth position Z1 is larger than the minimum value of the carrier lifetime in the region from the hydrogen peak 271-1 to the hydrogen peak 271-4. The carrier lifetime in the region from the depth position Zt to the depth position Z1 may be 80% or more and may be 90% or more of the maximum value of the carrier lifetime in the semiconductor substrate 10. The range of the variation of carrier lifetime in a region from the depth position Zt to the depth position Z1 may be ±20% or less of the average value of the carrier lifetime in the region. In addition, in the region from the depth position Zt to the depth position Z1, the helium chemical concentration is approximately 0, or is 1% or less of the peak value of the helium chemical concentration in the lifetime adjustment portion 250. The carrier lifetime in the semiconductor substrate 10 may be 10 µs or more, and or may be 30 µs or more. The carrier lifetime in the semiconductor substrate 10 may be 1000 µs or less, may be 300 µs or less, and may be 100 µs or less.

It is noted that in the region from the depth position Zt to the depth position Z1, the vacancy density distribution 232 (or a recombination center distribution) may have a distribution similar to that of the above-mentioned carrier lifetime. For example, in the region from the depth position Zt to the depth position Z1, the vacancy density may be flat, monotonously increased, or monotonously decreased. That is, the vacancy density distribution does not have a valley or a peak in the region. In the region from the depth position Zt to the depth position Z1, the vacancy density of the vacancy density distribution 232 may be $1 \times 10^{13}/cm^3$ or less, may be $1 \times 10^{12}/cm^3$ or less, may be and $1 \times 10^{11}/cm^3$ or less. The vacancy density being $1 \times 10^{13}/cm^3$ or less may be considered substantially 0.

The vacancy density or the carrier lifetime in a central portion of the semiconductor substrate 10 in the depth direction may substantially equal to the vacancy density or the carrier lifetime in the first high concentration region 20-1. The average value of the distribution in the depth direction may be used as the value of the vacancy density or the carrier lifetime in the first high concentration region 20-1. When the ratio of two carrier lifetimes is 0.8 or more and 1.2 or less may be considered substantially equal. The central portion of the semiconductor substrate 10 may be the drift region 18 or may be the first high concentration region 20-1.

Assume that the distance from the lower surface 23 of the semiconductor substrate 10 to the lower end position Zt of the trench portion is a first distance L1. In addition, assume that the distance from the lower surface 23 to the depth position Z1 is a second distance Z1. The second distance Z1 may be 0.3 times or more and 0.8 times or less the first distance L1. Setting the second distance Z1 0.3 times or more the first distance L1 allows the acceleration energy of hydrogen ion to be high, which allows the extension width W1 to be large. The second distance Z1 may be 0.4 times or more the first distance L1. By setting the second distance Z1 0.8 times or less the first distance L1, the first high concentration region 20-1 is less likely to reach the base region 14. The second distance Z1 may be 0.6 times or less, and may be 0.45 times or less the first distance L1.

Figure 10:
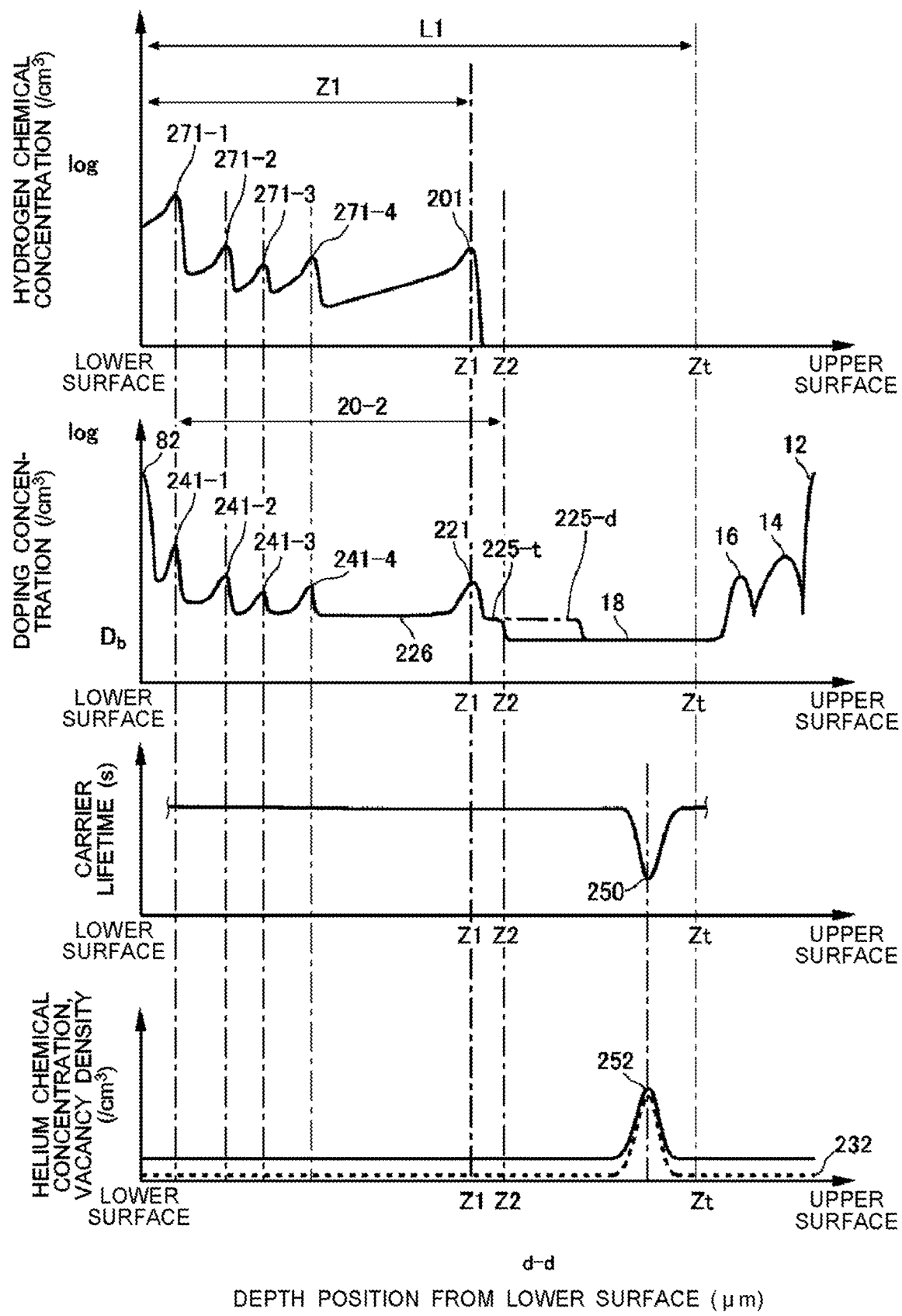
FIG. 10 shows example distributions of the hydrogen chemical concentration, the doping concentration, the carrier lifetime, and the helium chemical concentration in the depth direction at a position shown by a line d-d of FIG. 8.

FIG. 10 shows example distributions of the hydrogen chemical concentration, the doping concentration, the carrier lifetime, and the helium chemical concentration in the depth direction at a position shown by a line d-d of FIG. 8. The line d-d passes is parallel to the Z axis and passes through the lifetime adjustment portion 250 as well. In addition, the high concentration region 20 provided in the diode portion 80 is referred to as a second high concentration region 20-2.

The hydrogen chemical concentration distribution of this example is similar to the hydrogen chemical concentration distribution shown in FIG. 9. In addition, the doping concentration distribution of this example is identical to the doping concentration distribution shown in FIG. 9 except for having the cathode region 82 instead of the collector region 22.

The diode portion 80 has a lifetime adjustment portion 250 at which the carrier lifetime shows a local minimum value in the region between the depth position Zt and the depth position Z1. Helium is implanted to form the lifetime adjustment portion 250 of this example. The diode portion 80 may have a helium peak 252 at the depth position same as the lifetime adjustment portion 250. Meanwhile, in the lifetime non-adjustment portion 260 shown in FIG. 9, the helium chemical concentration distribution of the depth position same as the helium peak 252 is flat.

If helium ions are implanted from the lower surface 23 of the semiconductor substrate 10, many lattice defects, such as vacancies, are formed in the region through which the helium ions have passed. The vacancy density in a region from the depth position Z1 to the helium implantation position of the diode portion 80 in this case is higher than that of the transistor portion 70. Therefore, the extending length of the second high concentration region 20-2 toward the upper surface 21 may be longer than the extending length of the first high concentration region 20-1 toward the upper surface 21. In other words, in a depth direction from the upper surface 21 to the lower surface 23 of the semiconductor substrate 10, the vacancy density of the diode portion 80 may have a portion higher than the vacancy density of the transistor portion 70. However, the extension widths W1 (see FIG. 2) of both the first high concentration region 20-1 and the second high concentration region 20-2 are 4 μm or more. By adjusting the acceleration energy of hydrogen ions, the extension width W1 of the high concentration region 20 can be 4 μm or more even in a region to which charged particles are not irradiated. Therefore, without providing an unnecessary lifetime adjustment portion 250 on the upper surface 21 side of the transistor portion 70, a first high concentration region 20-1 which is long in the depth direction can be formed. An upper side flat portion 225-$d$ of the diode portion 80 may extend on the upper surface 21 side relative to the upper side flat portion 225-$t$ of the transistor portion 70. In this case, helium ions may be implanted from the lower surface 23 side.

Figure 11:
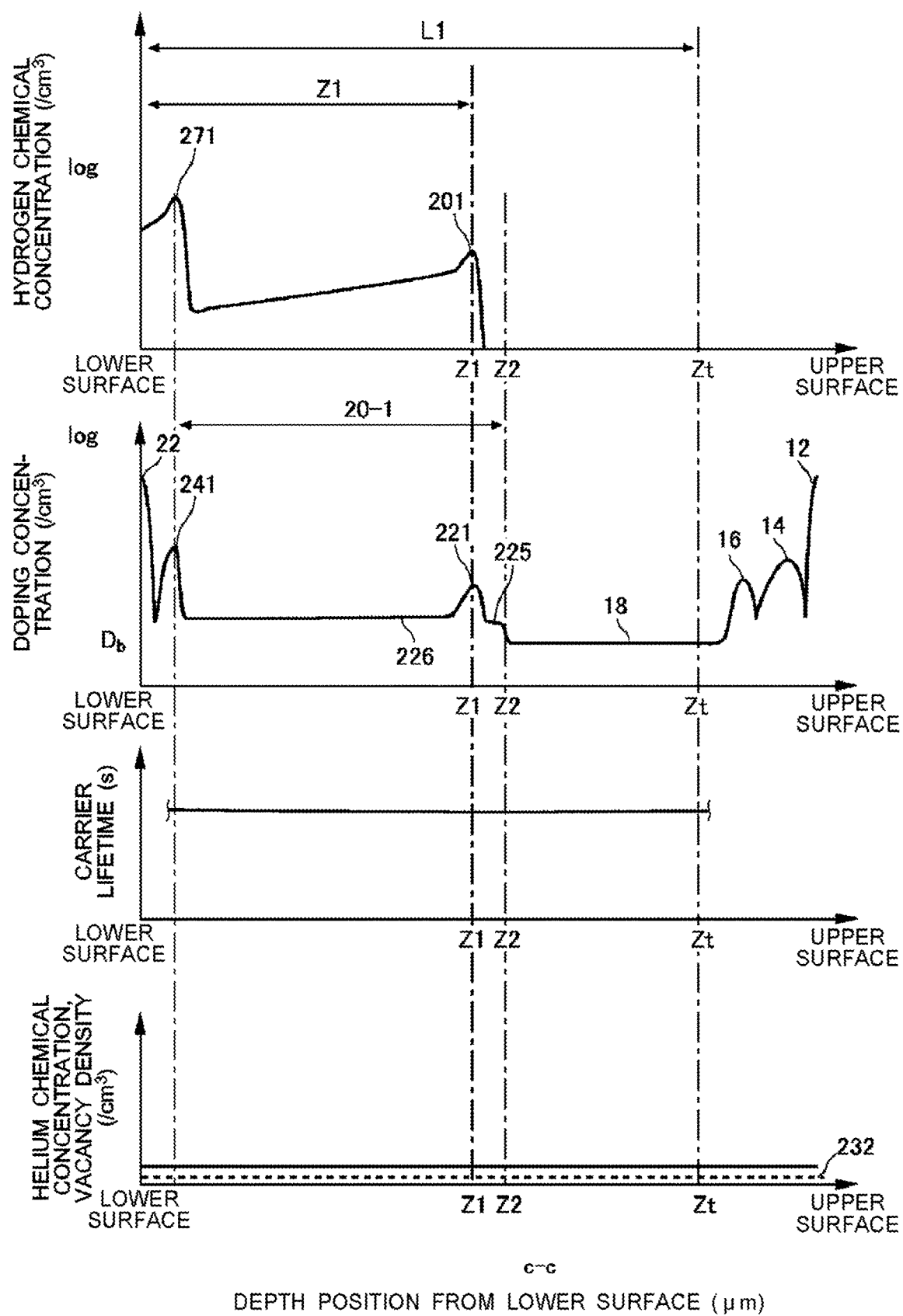
FIG. 11 shows other example distributions of the hydrogen chemical concentration, the doping concentration, the carrier lifetime, and the helium chemical concentration in the depth direction at a position shown by a line c-c of FIG. 8.

FIG. 11 shows other example distributions of the hydrogen chemical concentration, the doping concentration, the carrier lifetime, and the helium chemical concentration in the depth direction at a position shown by a line c-c of FIG. 8. The hydrogen chemical concentration distribution of this example has one hydrogen peak 271 in a region from the lower surface 23 to the depth position Z1. In addition, the doping concentration distribution of this example has one donor concentration peak 241 in the region from the lower surface 23 to the depth position Z1. Other distributions are similar to the example distributions of FIG. 9. The distance between the hydrogen peak 271 and donor concentration peak 241 and the lower surface 23 may be half or less, and may be ¼ or less of the distance Z1.

Figure 12:
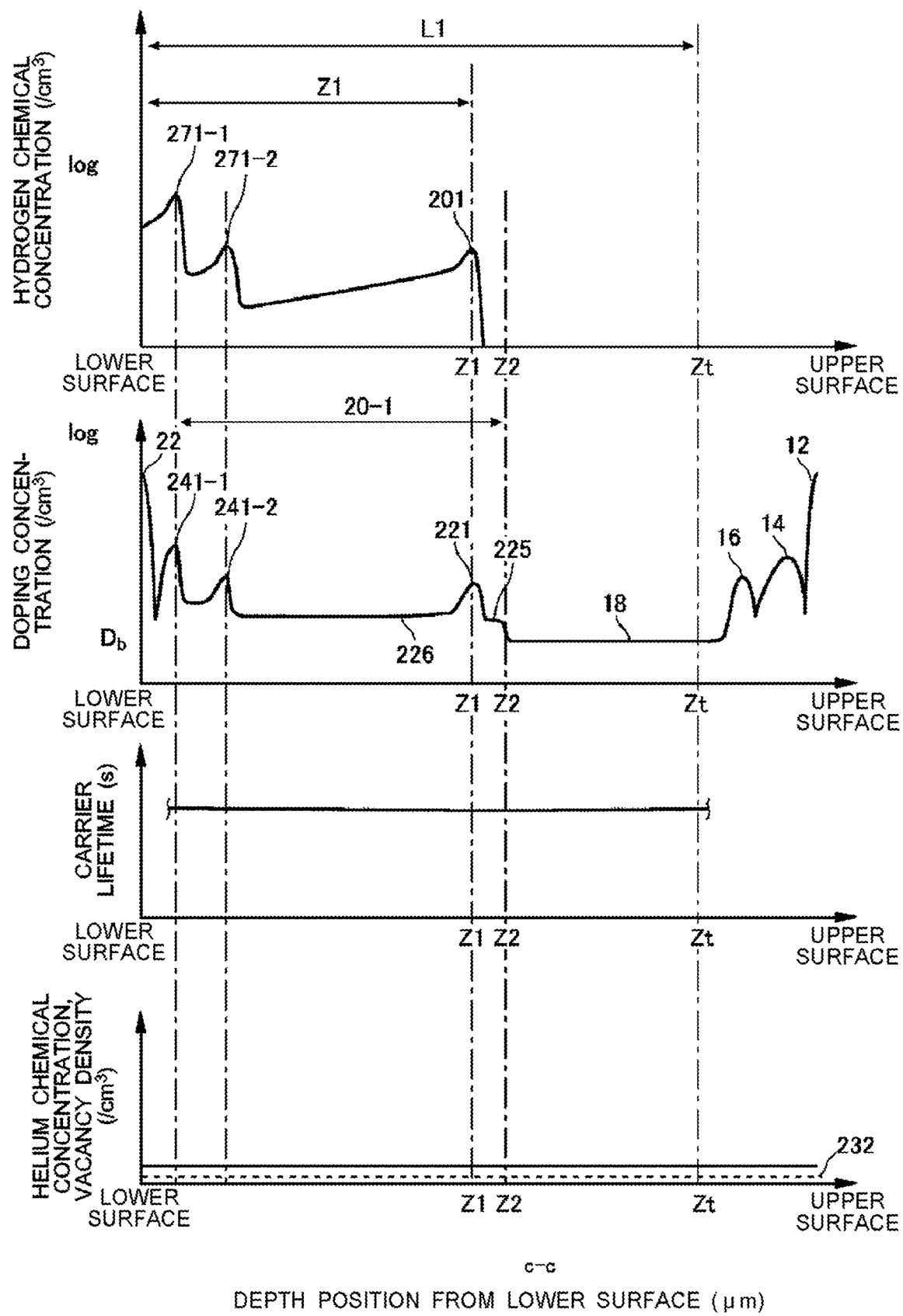
FIG. 12 shows other example distributions of the hydrogen chemical concentration, the doping concentration, the carrier lifetime, and the helium chemical concentration in the depth direction at a position shown by a line c-c of FIG. 8.

FIG. 12 shows other example distributions of the hydrogen chemical concentration, the doping concentration, the carrier lifetime, and the helium chemical concentration in the depth direction at a position shown by a line c-c of FIG. 8. The hydrogen chemical concentration distribution of this example has two hydrogen peaks 271-1 and 271-2 in the region from the lower surface 23 to the depth position Z1. In addition, the doping concentration distribution of this example has two donor concentration peaks 241-1 and 241-2 in a region from the lower surface 23 to the depth position Z1. Other distributions are similar to the example distributions of FIG. 9. The distance of the hydrogen peak 271-2 and donor concentration peak 241-2 arranged farthest from the lower surface 23 and the from the lower surface 23 may be half or less, and may be ¼ or less of the distance Z1.

Figure 13:
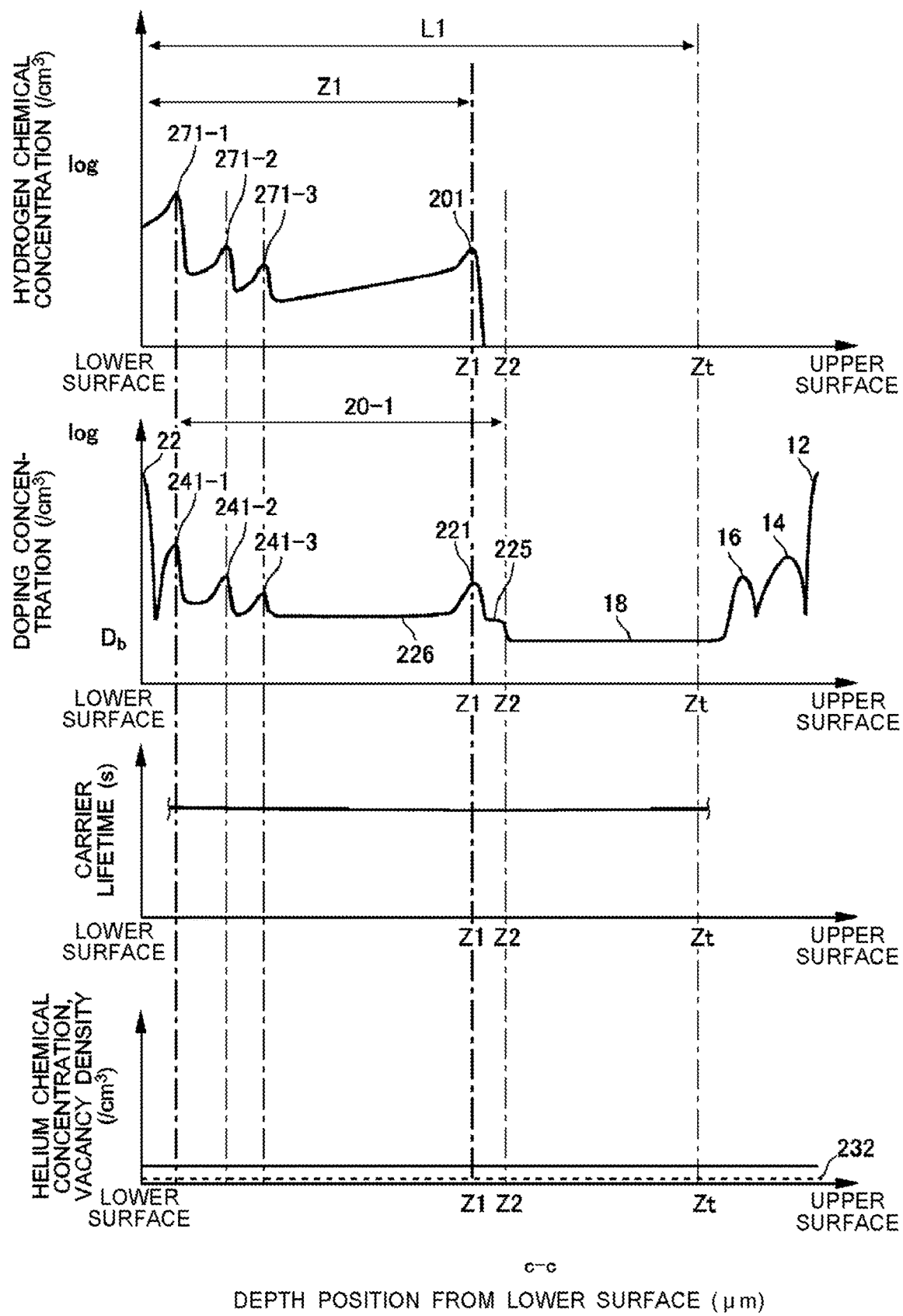
FIG. 13 shows other example distributions of the hydrogen chemical concentration, the doping concentration, the carrier lifetime, and the helium chemical concentration in the depth direction at a position shown by a line c-c of FIG. 8.

FIG. 13 shows other example distribution of the hydrogen chemical concentration, the doping concentration, the carrier lifetime, and the helium chemical concentration in the depth direction at the position shown by the line c-c of FIG. 8. The hydrogen chemical concentration distribution of this example has three hydrogen peaks 271-1, 271-2, and 271-3 in the region from the lower surface 23 to the depth position Z1. In addition, the doping concentration distribution of this example has three donor concentration peaks 241-1, 241-2, and 241-3 in the region from the lower surface 23 to the depth position Z1. Other distributions are similar to the example distributions of FIG. 9. The distance of the hydrogen peak 271-3 and the donor concentration peak 241-3 from the lower surface 23 may be half or less, and may be ¼ or less of the distance Z1.

Figure 14:
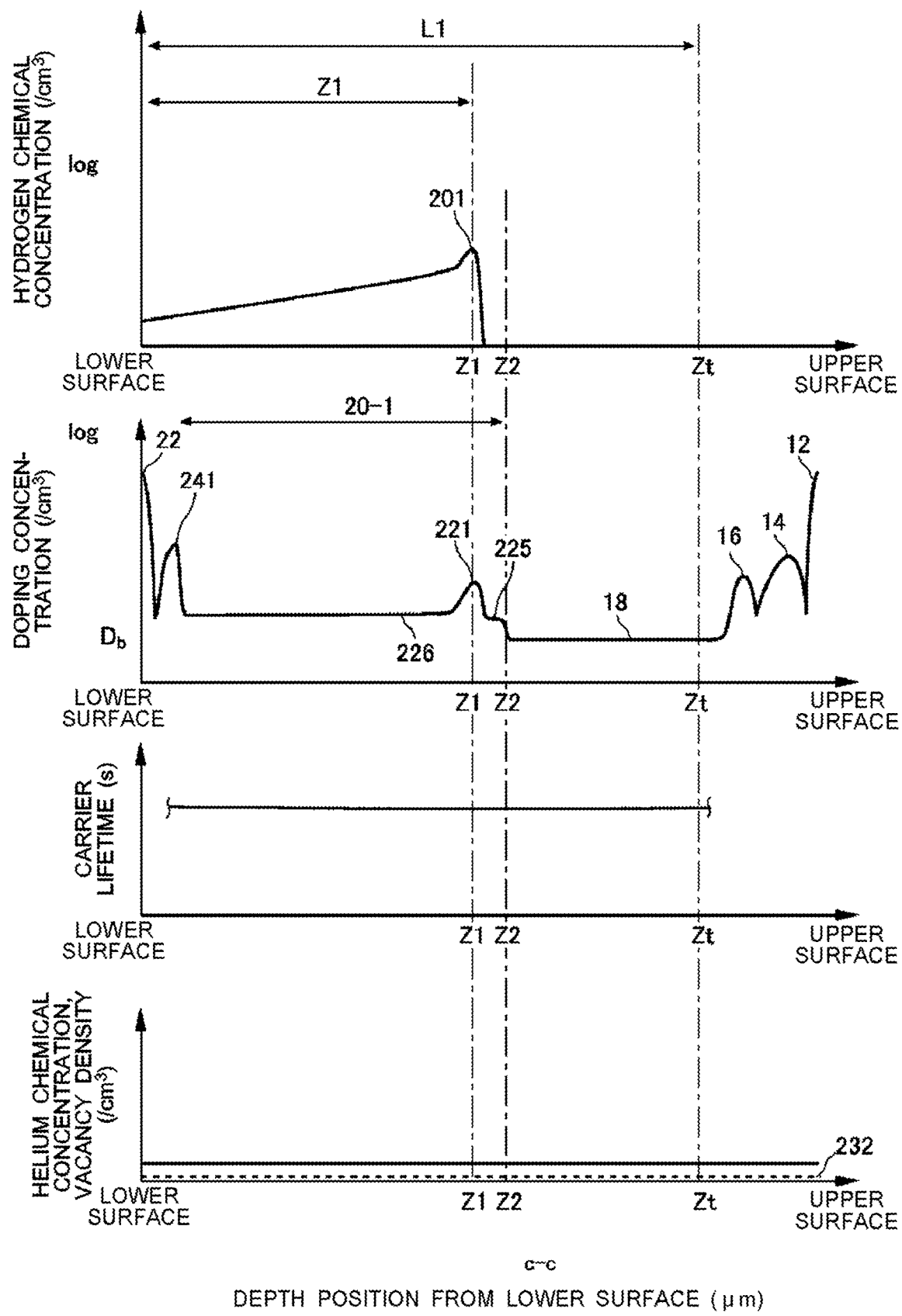
FIG. 14 shows other example distributions of the hydrogen chemical concentration, the doping concentration, the carrier lifetime, and the helium chemical concentration in the depth direction at a position shown by a line c-c of FIG. 8.

FIG. 14 shows other example distributions of the hydrogen chemical concentration, the doping concentration, the carrier lifetime, and the helium chemical concentration in the depth direction at a position shown by a line c-c of FIG. 8. The hydrogen chemical concentration distribution of this example does not have a hydrogen peak 271 in the region from the lower surface 23 to the depth position Z1. The hydrogen chemical concentration monotonously decreases in a direction from the depth position Z1 toward the lower surface 23. In addition, the doping concentration distribution of this example has one or more donor concentration peaks 241 in the region from the lower surface 23 to the depth position Z1. Any of donor concentration peaks 241 is a peak of a donor (for example, phosphorus) other than a hydrogen donor. An example distribution having one donor concentration peak 241 is shown in FIG. 14, a plurality of donor concentration peaks 241 may be provided, as shown in FIG. 9, FIG. 12, or FIG. 13. In this case, the donor concentration peak 241 closest to the lower surface 23 may be the peak of a donor, such as phosphorus. Other donor concentration peaks 241 may be a peak of a hydrogen donor.

Figure 15:
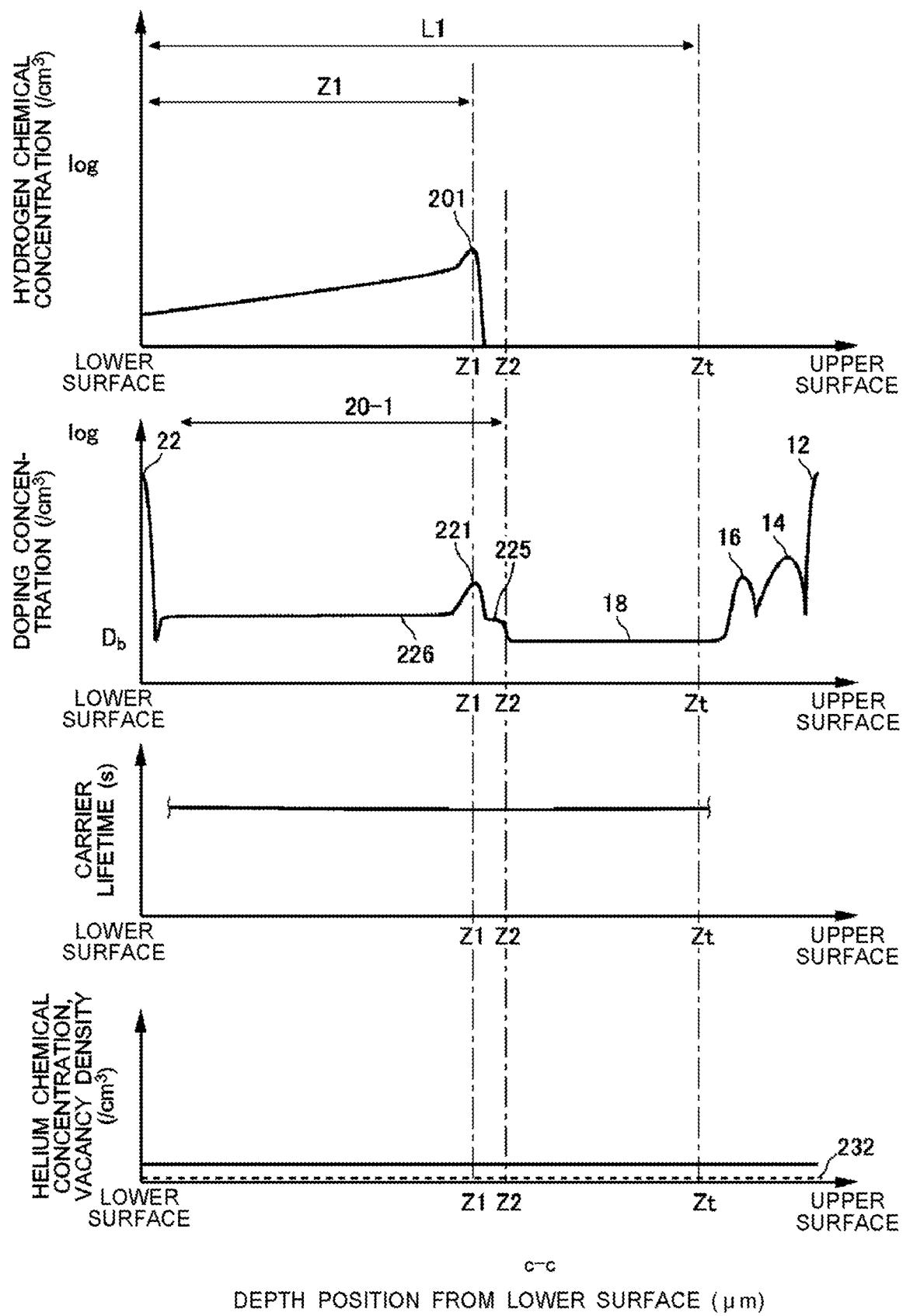
FIG. 15 shows other example distributions of the hydrogen chemical concentration, the doping concentration, the carrier lifetime, and the helium chemical concentration in the depth direction at a position shown by a line c-c of FIG. 8.

FIG. 15 shows other example distributions of the hydrogen chemical concentration, the doping concentration, the carrier lifetime, and the helium chemical concentration in the depth direction at a position shown by a line c-c of FIG. 8. The hydrogen chemical concentration distribution of this example does not have a hydrogen peak 271 in the region from the lower surface 23 to the depth position Z1. The hydrogen chemical concentration monotonously decreases in a direction from the depth position Z1 toward the lower surface 23. In addition, the doping concentration distribution of this example does not have a donor concentration peak 241 in the region from the lower surface 23 to the depth position Z1. The doping concentration may monotonously decrease in a direction from the depth position Z1 toward the collector region 22. In this example, the semiconductor substrate 10 is preferably thick so that the depletion layer expanding from the upper surface 21 side does not reach the collector region 22. In addition, the distance from the lower surface 23 to the depth position Z1 may be 80 μm or more, may be 100 μm or more, may be 150 μm or more, and may be 200 μm or more. Other distributions are similar to the example distributions of FIG. 9.

Figure 16:
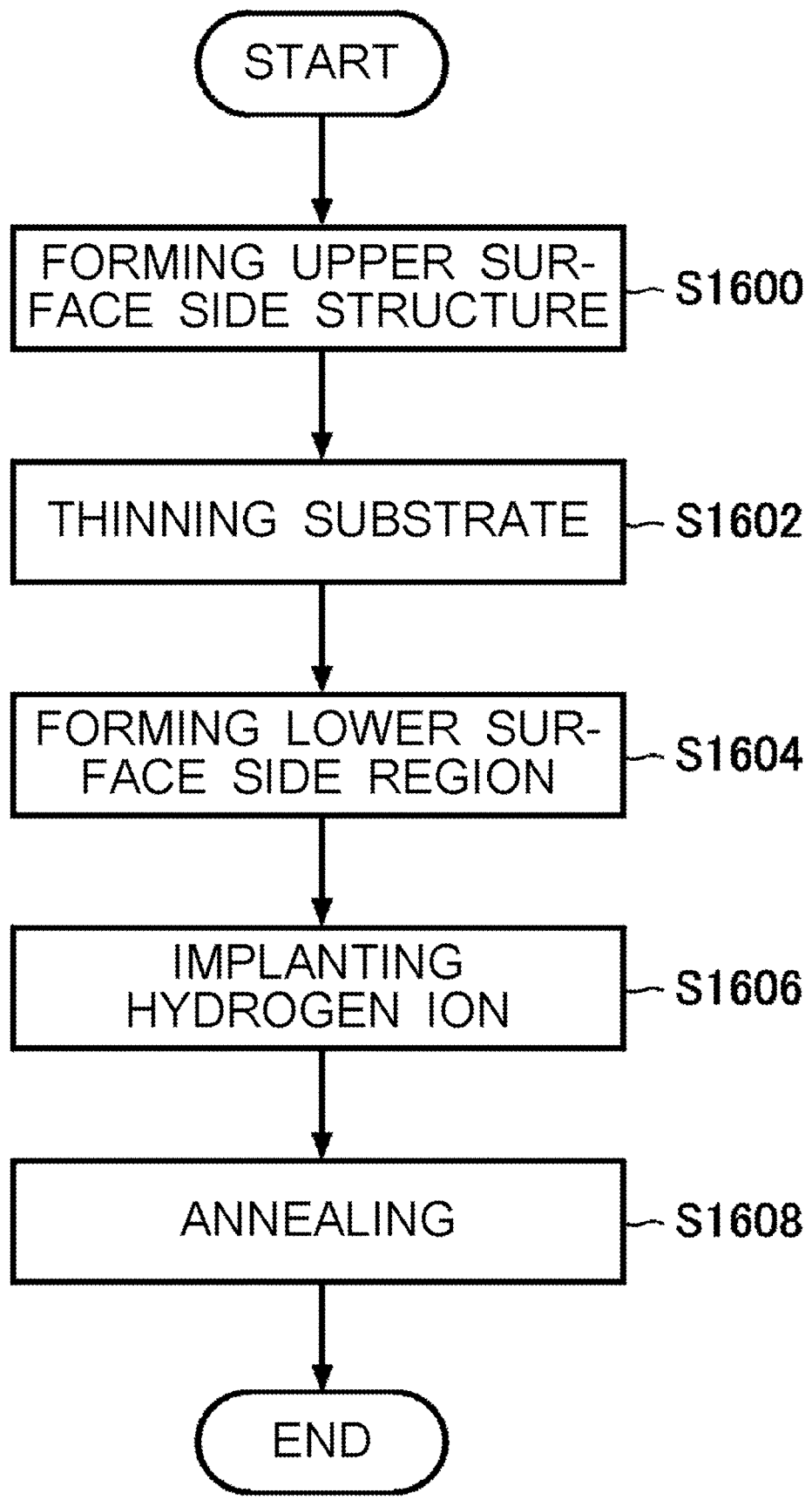
FIG. 16 illustrates one example of a manufacturing method of the semiconductor device 100.

FIG. 16 illustrates one example of a manufacturing method of the semiconductor device 100. In FIG. 16, only some processes of the manufacturing processes of the semiconductor device 100 are shown. In this example, first, an upper surface side structure of the semiconductor device 100 is formed (S1600). The upper surface side structure includes at least a part of the structure on the upper side relative to the center Zc of the semiconductor substrate 10. The upper surface side structure may include at least one of each trench portion, the emitter region 12, the base region 14, the accumulation region 16, the contact region 15, the interlayer dielectric film 38, the emitter electrode 52, and the gate runner.

Then, in substrate thinning step S1602, the lower surface 23 of the semiconductor substrate 10 is ground to adjust the thickness of the semiconductor substrate 10. In S1602, the thickness of the semiconductor substrate 10 is adjusted in accordance with the breakdown voltage to be provided to the semiconductor device 100.

Then, in lower surface side region forming step S1604, the collector region 22 is formed. In lower surface side region forming step S1604, the cathode region 82 may be formed. In lower surface side region forming step S1604, predetermined impurities may be implanted to the lower surface 23 of the semiconductor substrate 10, and annealing may be locally performed by a laser or the like to form the collector region 22 and the cathode region 82.

Then, in hydrogen implanting step S1606, hydrogen ions are implanted to the semiconductor substrate 10 from the lower surface 23 of the semiconductor substrate 10 at acceleration energy larger than 1.4 MeV. This allows a hydrogen peak 201 at which the hydrogen chemical concentration shows a local maximum value in the depth position Z1 to be formed. The acceleration energy may be large than 1.4 MeV, may be 1.5 MeV or more, may be 1.8 MeV or more, and may be 2.0 MeV or more.

The dose amount of hydrogen in hydrogen implanting step S1606 may be $1 \times 10^{12}/cm^2$ or more. The dose amount may be larger than $1 \times 10^{12}$ ions/$cm^2$, may be $1.5 \times 10^{12}$ ions/$cm^2$ or more, may be $2 \times 10^{12}$ ions/$cm^2$ or more, and may be $3 \times 10^{12}$ ions/$cm^2$ or more. The dose amount may be $1 \times 10^{15}$ ions/$cm^2$ or less, may be $1 \times 10^{14}$ ions/$cm^2$ or less, and may be $1 \times 10^{13}$ ions/$cm^2$ or less.

In addition, when the high concentration region 20 has one or more hydrogen peaks 271, in hydrogen implanting step S1606, hydrogen ions are implanted to the position of each hydrogen peak 271. In hydrogen implanting step S1606, hydrogen ions may be implanted to hydrogen peaks in order such that a hydrogen peak with a larger distance from the lower surface 23 becomes the object earlier among hydrogen peaks. In another example, ion implantation may be performed on hydrogen peaks in order, such that a hydrogen peak with a smaller distance from the lower surface 23 is the object of the hydrogen ion implantation earlier.

Then, in annealing step S1608, the semiconductor substrate 10 is annealed. In annealing step S1608, the entire semiconductor substrate 10 may be annealed in an annealing furnace. An annealing temperature in annealing step S1608 may be 300 or more and 420 or less. The annealing temperature may be 350 degrees C. or more. The annealing temperature may be 390 degrees C. or less. The annealing temperature of this example is 370 degrees C. The annealing time in annealing step S1608 is 0.5 hours or more and ten hours or less. The annealing time may be three hours or more. The annealing time may be seven hours or less. The annealing time of this example is five hours. Through annealing step S1608, a high concentration region 20 including a region extending for 4 μm or more in a direction from the local maximum 202 of the hydrogen peak 201 toward the upper surface 21 is formed.

In addition, if the diode portion 80 is provided with the lifetime adjustment portion 250, charged particles, such as helium, are implanted to the semiconductor substrate 10 after annealing step S1608. In addition, a collector electrode 24 is formed after annealing step S1608. Through such processes, the semiconductor device 100 can be manufactured.

Figure 17:
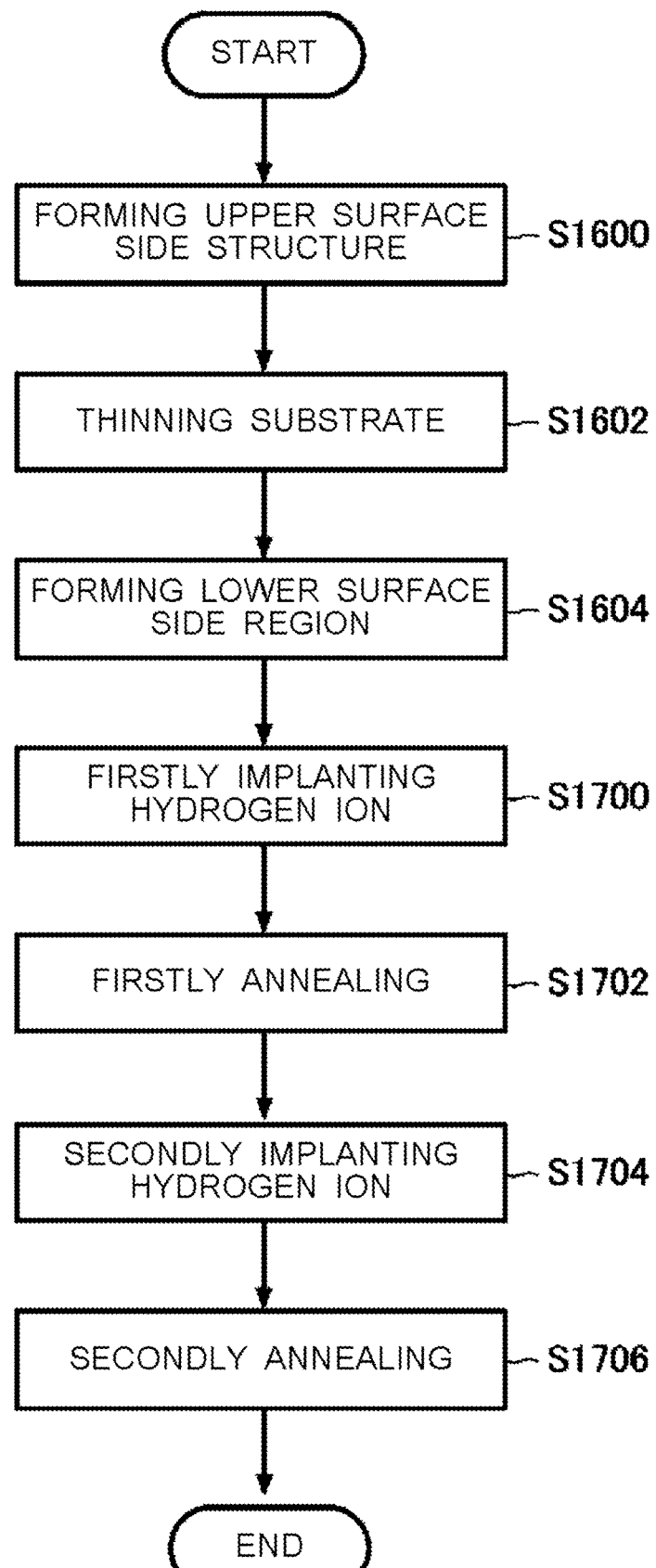
FIG. 17 illustrates another example of the manufacturing method of semiconductor device 100.

FIG. 17 illustrates another example of the manufacturing method of semiconductor device 100. This example includes, in addition to the processes following hydrogen implanting step S1606 of FIG. 16, first hydrogen implanting step S1700, first annealing step S1702, second hydrogen implanting step S1704, and second annealing step S1706. Processes from S1600 to S1604 are the same.

In first hydrogen implanting step S1700, hydrogen ions are implanted to the depth position Z1. Then, in first annealing step S1702, the semiconductor substrate 10 is annealed. In first annealing step S1702, the entire semiconductor substrate 10 may be annealed in an annealing furnace. The annealing temperature and the annealing time in first annealing step S1702 are similar to those in annealing step S1608 of FIG. 16.

Then, in second hydrogen implanting step S1704, hydrogen ions are implanted to a position to form the hydrogen peak 271. Then, in second annealing step S1706, the semiconductor substrate 10 is annealed. In second annealing step S1706, the entire semiconductor substrate 10 may be annealed in an annealing furnace. The annealing temperature in second annealing step S1706 may be lower than annealing temperature in first annealing step S1702. The annealing temperature may be 300 degrees C. or more and 420 degrees C. or less. The annealing temperature of this example is 360 degrees C. In addition, the annealing time in second annealing step S1706 may be the same as the annealing time in first annealing step S1702. The annealing time may be 0.5 hours or more and ten hours or less. The annealing time of this example is five hours.

Also in this example, if the diode portion 80 is provided with the lifetime adjustment portion 250, charged particles of helium or the like are implanted to the semiconductor substrate 10 after second annealing step S1706. In addition, a collector electrode 24 is formed after second annealing step S1706. Through such processes, the semiconductor device 100 can be manufactured.

Although the present invention has been described using the embodiments, the technical scope of the present invention is not limited to the scope described in the above embodiments. It is apparent to those skilled in the art that various modifications or improvements can be made to the above embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 14: base region, 15: contact region, 16: accumulation region, 18: drift region, 19: region, 20: high concentration region, 21: upper surface, 22: collector region, 23: lower surface, 24: collector electrode, 29: linear portion, 30: dummy trench portion, 31: edge portion, 32: dummy dielectric film, 34: dummy conductive portion, 38: interlayer dielectric film, 39: linear portion, 40: gate trench portion, 41: edge portion, 42: gate dielectric film, 44: gate conductive portion, 52: emitter electrode, 54: contact hole, 60, 61: mesa portion, 70: transistor portion, 80: diode portion, 81: extension region, 82: cathode region, 90: edge termination structure portion, 92: guard ring, 100: semiconductor device, 102: end side, 112: gate pad, 130: outer circumferential gate runner, 131: active-side gate runner, 160: active portion, 201: hydrogen peak, 202: local maximum, 203: upper tail, 204: lower tail, 221: donor concentration peak, 222: local maximum, 223: upper tail, 224: lower tail, 225: upper side flat portion, 226: lower side flat portion, 231: vacancy density peak, 232: distribution, 241: donor concentration peak, 250: lifetime adjustment portion, 251: vacancy density peak, 252: helium peak, 260: lifetime non-adjustment portion, 271: hydrogen peak

What is claimed is:

1. A semiconductor device provided with an IGBT, comprising:
   a semiconductor substrate having an upper surface and a lower surface, wherein bulk donors are distributed throughout the semiconductor substrate having a drift region in which a doping concentration is a donor concentration of the bulk donors;
   a hydrogen peak including: a local maximum arranged 25 µm or more away from the lower surface of the semiconductor substrate in a depth direction, wherein a hydrogen chemical concentration shows a local maximum value at the local maximum; an upper tail in which the hydrogen chemical concentration decreases in a direction from the local maximum toward the upper surface; and a lower tail in which the hydrogen chemical concentration decreases in a direction from the local maximum toward the lower surface more gradually than the upper tail;
   a donor concentration peak provided at a depth position identical to the hydrogen peak, wherein a donor concentration distribution in the depth direction shows a peak at the donor concentration peak;
   a first high concentration region having a donor concentration higher than a bulk donor concentration and including a region extending for 4 µm or more from the local maximum of the hydrogen peak toward the upper surface;
   an upper side flat portion arranged on an upper surface side of the semiconductor substrate relative to the donor concentration peak, wherein a donor concentration distribution in the depth direction is flat and substantially constant in the upper side flat portion; and
   a lower side flat portion arranged on a lower surface side of the semiconductor substrate relative to the donor concentration peak, wherein a donor concentration distribution in the depth direction is flat and substantially constant in the lower side flat portion, wherein
   a donor concentration of the upper side flat portion is 0.5 times or more and twice or less a donor concentration of the lower side flat portion, and
   a length of the lower side flat portion from a location of the peak to a doping concentration peak next to the peak toward the lower surface side is longer than a length of the upper side flat portion.

2. The semiconductor device according to claim 1, wherein
   a vacancy concentration or a carrier lifetime in a central portion of the semiconductor substrate is substantially equal to a vacancy concentration or a carrier lifetime in the first high concentration region.

3. The semiconductor device according to claim 2, wherein
   the semiconductor substrate has a transistor portion provided with the IGBT and a diode portion provided with a diode,
   the diode portion is arranged on the upper surface side relative to the hydrogen peak and has a lifetime adjustment portion in which a carrier lifetime distribution in the depth direction shows a local minimum value,
   the transistor portion has, at a depth position identical to the lifetime adjustment portion of the diode portion, a lifetime non-adjustment portion in which the carrier lifetime distribution does not show a local minimum value, and
   the hydrogen peak and the first high concentration region are provided in a region overlapping with the lifetime non-adjustment portion in the depth direction.

4. The semiconductor device according to claim 3, wherein
   the hydrogen peak is arranged on an upper surface side of the semiconductor substrate.

5. The semiconductor device according to claim 1, further comprising:
   a trench portion provided on the upper surface of the semiconductor substrate, wherein
   a carrier lifetime is flat, monotonously increased, or monotonously decreased in a region from a lower end of the trench portion to the hydrogen peak.

6. The semiconductor device according to claim 5, wherein
   the lower end of the trench portion is arranged away from the lower surface by a first distance, and
   a second distance between the hydrogen peak and the lower surface is 0.3 times or more and 0.8 times or less the first distance.

7. The semiconductor device according to claim 6, wherein
   the semiconductor substrate has a transistor portion provided with the IGBT and a diode portion provided with a diode,
   the diode portion is arranged on the upper surface side relative to the hydrogen peak and has a lifetime adjustment portion in which a carrier lifetime distribution in the depth direction shows a local minimum value,
   the transistor portion has, at a depth position identical to the lifetime adjustment portion of the diode portion, a lifetime non-adjustment portion in which the carrier lifetime distribution does not show a local minimum value, and
   the hydrogen peak and the first high concentration region are provided in a region overlapping with the lifetime non-adjustment portion in the depth direction.

8. The semiconductor device according to claim 7, wherein
   the hydrogen peak is arranged on an upper surface side of the semiconductor substrate.

9. The semiconductor device according to claim 5, wherein
   the semiconductor substrate has a transistor portion provided with the IGBT and a diode portion provided with a diode,
   the diode portion is arranged on the upper surface side relative to the hydrogen peak and has a lifetime adjustment portion in which a carrier lifetime distribution in the depth direction shows a local minimum value,
   the transistor portion has, at a depth position identical to the lifetime adjustment portion of the diode portion, a lifetime non-adjustment portion in which the carrier lifetime distribution does not show a local minimum value, and
   the hydrogen peak and the first high concentration region are provided in a region overlapping with the lifetime non-adjustment portion in the depth direction.

10. The semiconductor device according to claim 9, wherein
the hydrogen peak is arranged on an upper surface side of the semiconductor substrate.

11. The semiconductor device according to claim 1, wherein
the hydrogen peak is arranged on an upper surface side of the semiconductor substrate.

12. The semiconductor device according to claim 1, wherein
the semiconductor substrate has a transistor portion provided with the IGBT and a diode portion provided with a diode,
the diode portion is arranged on the upper surface side relative to the hydrogen peak and has a lifetime adjustment portion in which a carrier lifetime distribution in the depth direction shows a local minimum value,
the transistor portion has, at a depth position identical to the lifetime adjustment portion of the diode portion, a lifetime non-adjustment portion in which the carrier lifetime distribution does not show a local minimum value, and
the hydrogen peak and the first high concentration region are provided in a region overlapping with the lifetime non-adjustment portion in the depth direction.

13. The semiconductor device according to claim 12, wherein
the lifetime adjustment portion has a helium peak at which a helium chemical concentration distribution in the depth direction shows a peak, and
the lifetime non-adjustment portion has the helium chemical concentration distribution flat at a depth position identical to the helium peak.

14. The semiconductor device according to claim 12, wherein
the diode portion has:
the hydrogen peak; and
a second high concentration region having a donor concentration higher than the bulk donor concentration and including a region extending from the hydrogen peak toward the upper surface, and
an extending length of the second high concentration region toward the upper surface is longer than an extending length of the first high concentration region toward the upper surface.

15. The semiconductor device according to claim 1, wherein
the semiconductor substrate has a transistor portion provided with the IGBT and a diode portion provided with a diode,
the diode portion is arranged on the upper surface side relative to the hydrogen peak and has a lifetime adjustment portion in which a carrier lifetime distribution in the depth direction shows a local minimum value,
the transistor portion has, at depth position identical to the lifetime adjustment portion of the diode portion, a lifetime non-adjustment portion in which the carrier lifetime distribution does not show a local minimum value, and
the hydrogen peak and the first high concentration region are provided in a region overlapping with the lifetime non-adjustment portion in the depth direction.

16. The semiconductor device according to claim 15, wherein
the hydrogen peak is arranged on an upper surface side of the semiconductor substrate.

17. The semiconductor device according to claim 1, wherein
the hydrogen peak is arranged on an upper surface side of the semiconductor substrate.

18. The semiconductor device according to claim 1, wherein
the donor concentration distribution in the upper side flat portion has a maximum in a given region among a plurality of regions having a range of variation of donor concentration within ±50% of an average value of the donor concentration in the plurality of regions.

19. The semiconductor device according to claim 1, wherein
the donor concentration distribution in the lower side flat portion has a maximum in a given region among a plurality of regions having a range of variation of donor concentration within ±50% of an average value of the donor concentration in the plurality of regions.

20. The semiconductor device according to claim 1, wherein
a value obtained by integrating chemical concentrations of hydrogen atoms for a range of a full width at half maximum of the hydrogen peak in the depth direction is $1 \times 10^{12}$ ions/cm$^2$ or more and less than $1 \times 10^{13}$ ions/cm$^2$.

21. The semiconductor device according to claim 1, wherein
a length of the upper side flat portion in the depth direction is 16 μm or more.

22. The semiconductor device according to claim 1, wherein
a carrier lifetime in the upper side flat portion is substantially the same as a carrier lifetime in at least a portion of the drift region that is in contact with the upper side flat portion.

23. The semiconductor device according to claim 22, wherein
a difference of the carrier lifetime between the carrier lifetime in the upper side flat portion and the carrier lifetime in the portion of the drift region that is in contact with the upper side flat portion is within 10%.

24. The semiconductor device according to claim 1, wherein
a difference in the vacancy density between the vacancy density in the upper side flat portion and the vacancy density in a portion of the drift region that is in contact with the upper side flat portion is within 10%.

25. The semiconductor device according to claim 1, wherein
the semiconductor substrate is MCZ substrate, containing an oxygen density in a range from $1 \times 10^{17}$ to $1 \times 10^{18}$ atoms/cm$^3$ and a carbon density in a range from $1 \times 10^{13}$ to $1 \times 10^{16}$ atoms/cm$^3$.

26. A semiconductor device provided with an IGBT, comprising:
a semiconductor substrate having an upper surface and a lower surface, wherein bulk donors are distributed throughout the semiconductor substrate having a drift region in which a doping concentration is a donor concentration of the bulk donors;
a hydrogen peak including: a local maximum arranged 25 μm or more away from the lower surface of the semiconductor substrate in a depth direction, wherein a hydrogen chemical concentration shows a local maximum value at the local maximum; an upper tail in which the hydrogen chemical concentration decreases in a direction from the local maximum toward the upper surface; and a lower tail in which the hydrogen chemical concentration decreases in a direction from the local maximum toward the lower surface more gradually than the upper tail;

a first high concentration region having a donor concentration higher than a bulk donor concentration and including a region extending for 4 µm or more from the local maximum of the hydrogen peak toward the upper surface;

a donor concentration peak provided at a depth position identical to the hydrogen peak, wherein a donor concentration distribution in the depth direction shows a peak at the donor concentration peak;

an upper side flat portion arranged on an upper surface side of the semiconductor substrate relative to the donor concentration peak, wherein a donor concentration distribution in the depth direction is flat and substantially constant in the upper side flat portion; and a lower side flat portion arranged on a lower surface side of the semiconductor substrate relative to the donor concentration peak, wherein a donor concentration distribution in the depth direction is flat and substantially constant in the lower side flat portion, wherein a donor concentration of the upper side flat portion is 0.5 times or more and twice or less a donor concentration of the lower side flat portion, and a trench portion provided on the upper surface of the semiconductor substrate, a carrier lifetime distribution from a lower surface side of the upper side flat portion to a bottom depth of the trench portion is substantially constant.

27. A semiconductor device provided with an IGBT, comprising:

a semiconductor substrate having an upper surface and a lower surface, wherein bulk donors are distributed throughout the semiconductor substrate having a drift region in which a doping concentration is a donor concentration of the bulk donors;

a hydrogen peak including: a local maximum arranged 25 µm or more away from the lower surface of the semiconductor substrate in a depth direction, wherein a hydrogen chemical concentration shows a local maximum value at the local maximum; an upper tail in which the hydrogen chemical concentration decreases in a direction from the local maximum toward the upper surface; and a lower tail in which the hydrogen chemical concentration decreases in a direction from the local maximum toward the lower surface more gradually than the upper tail;

a first high concentration region having a donor concentration higher than a bulk donor concentration and including a region extending for 4 µm or more from the local maximum of the hydrogen peak toward the upper surface;

a donor concentration peak provided at a depth position identical to the hydrogen peak, wherein a donor concentration distribution in the depth direction shows a peak at the donor concentration peak;

an upper side flat portion arranged on an upper surface side of the semiconductor substrate relative to the donor concentration peak, wherein a donor concentration distribution in the depth direction is flat and substantially constant in the upper side flat portion; and a lower side flat portion arranged on a lower surface side of the semiconductor substrate relative to the donor concentration peak, wherein a donor concentration distribution in the depth direction is flat and substantially constant in the lower side flat portion, wherein a donor concentration of the upper side flat portion is 0.5 times or more and twice or less a donor concentration of the lower side flat portion, and a depth of the donor concentration peak from the lower surface length is more than 30 µm.

28. A semiconductor device provided with an IGBT, comprising:

a semiconductor substrate having an upper surface and a lower surface, wherein bulk donors are distributed throughout the semiconductor substrate having a drift region in which a doping concentration is a donor concentration of only the bulk donors;

a hydrogen peak including: a local maximum arranged 25 µm or more away from the lower surface of the semiconductor substrate in a depth direction, wherein a hydrogen chemical concentration shows a local maximum value at the local maximum; an upper tail in which the hydrogen chemical concentration decreases in a direction from the local maximum toward the upper surface; and a lower tail in which the hydrogen chemical concentration decreases in a direction from the local maximum toward the lower surface more gradually than the upper tail;

a first high concentration region having a donor concentration higher than the donor concentration of only the bulk donors and including a region extending for 4 µm or more from the local maximum of the hydrogen peak toward the upper surface;

a donor concentration peak provided at a depth position identical to the hydrogen peak, wherein a distribution of the donor concentration in the depth direction shows a peak at the donor concentration peak;

an upper side flat portion arranged on an upper surface side of the semiconductor substrate relative to the donor concentration peak, wherein the distribution of the donor concentration in the depth direction is flat and substantially constant in the upper side flat portion; and a lower side flat portion arranged on a lower surface side of the semiconductor substrate relative to the donor concentration peak, wherein the distribution of the donor concentration in the depth direction is flat and substantially constant in the lower side flat portion, wherein a donor concentration of the upper side flat portion is 0.5 times or more and twice or less a donor concentration of the lower side flat portion, and a vacancy density at a depth of a central point of the upper side flat portion of the donor concentration is substantially the same as a vacancy density at a central point of the lower side flat portion.

29. A semiconductor device provided with an IGBT, comprising:

a semiconductor substrate having an upper surface and a lower surface, wherein bulk donors are distributed throughout the semiconductor substrate having a drift region in which a doping concentration is a donor concentration of only the bulk donors;

a hydrogen peak including: a local maximum arranged 25 µm or more away from the lower surface of the semiconductor substrate in a depth direction, wherein a hydrogen chemical concentration shows a local maximum value at the local maximum; an upper tail in which the hydrogen chemical concentration decreases in a direction from the local maximum toward the upper surface; and a lower tail in which the hydrogen chemical concentration decreases in a direction from the local maximum toward the lower surface more gradually than the upper tail;

a first high concentration region having a donor concentration higher than the donor concentration of only the bulk donors and including a region extending for 4 μm or more from the local maximum of the hydrogen peak toward the upper surface;

a donor concentration peak provided at a depth position identical to the hydrogen peak, wherein a distribution of the donor concentration in the depth direction shows a peak at the donor concentration peak;

an upper side flat portion arranged on an upper surface side of the semiconductor substrate relative to the donor concentration peak, wherein the distribution of the donor concentration in the depth direction is flat and substantially constant in the upper side flat portion; and a lower side flat portion arranged on a lower surface side of the semiconductor substrate relative to the donor concentration peak, wherein the distribution of the donor concentration in the depth direction is flat and substantially constant in the lower side flat portion, wherein a donor concentration of the upper side flat portion is 0.5 times or more and twice or less a donor concentration of the lower side flat portion, and a carrier lifetime at a depth of a central point of the upper side flat portion of the donor concentration is substantially the same as the carrier lifetime at a central point of the lower side flat portion.

* * * * *